United States Patent
Fisher et al.

(10) Patent No.: US 8,969,122 B2
(45) Date of Patent: Mar. 3, 2015

(54) PROCESSES FOR UNIFORM METAL SEMICONDUCTOR ALLOY FORMATION FOR FRONT SIDE CONTACT METALLIZATION AND PHOTOVOLTAIC DEVICE FORMED THEREFROM

(75) Inventors: Kathryn C. Fisher, Brooklyn, NY (US); Qiang Huang, Sleepy Hollow, NY (US); Satyavolu S. Papa Rao, Poughkeepsie, NY (US); David L. Rath, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 888 days.

(21) Appl. No.: 13/159,897

(22) Filed: Jun. 14, 2011

(65) Prior Publication Data
US 2012/0318341 A1 Dec. 20, 2012

(51) Int. Cl.
*H01L 31/18* (2006.01)
*H01L 31/0216* (2014.01)
*H01L 31/0224* (2006.01)

(52) U.S. Cl.
CPC ...... *H01L 31/0216* (2013.01); *H01L 31/02168* (2013.01); *H01L 31/1864* (2013.01); *H01L 31/022425* (2013.01); *H01L 31/02167* (2013.01); *H01L 31/18* (2013.01); *H01L 31/022433* (2013.01); *Y02E 10/50* (2013.01)
USPC 438/72; 438/98; 257/E31.119; 257/E31.124; 136/256

(58) Field of Classification Search
CPC . H01L 31/18; H01L 31/1864; H01L 31/0216; H01L 31/02167; H01L 31/02168; H01L 31/0224; H01L 31/022425; H01L 31/022433
USPC ......... 438/57, 72, 98; 257/E31.119, E31.124; 136/256
See application file for complete search history.

(56) References Cited

U.S. PATENT DOCUMENTS

| 5,665,607 A | * | 9/1997 | Kawama et al. | 438/64 |
| 6,815,246 B2 | * | 11/2004 | Gonsiorawski et al. | 438/57 |
| 8,043,886 B2 | * | 10/2011 | Clevenger et al. | 438/98 |
| 2007/0148336 A1 | * | 6/2007 | Bachrach et al. | 427/97.1 |

(Continued)

*Primary Examiner* — Mary Wilczewski
(74) *Attorney, Agent, or Firm* — Scully, Scott, Murphy & Presser, P.C.; Louis J. Percello, Esq.

(57) ABSTRACT

Processes for fabricating photovoltaic devices in which the front side contact metal semiconductor alloy metallization patterns have a uniform thickness at edge portions as well as a central portion of each metallization pattern are provided. In one embodiment, a method of forming a photovoltaic device is provided that includes a p-n junction with a p-type semiconductor portion and an n-type semiconductor portion one on top of the other, wherein an upper exposed surface of one of the semiconductor portions represents a front side surface of the semiconductor substrate; forming a plurality of patterned antireflective coating layers on the front side surface of the semiconductor surface to provide a grid pattern including a busbar region and finger regions; forming a mask atop the plurality of patterned antireflective coating layers, the mask having a shape that mimics each patterned antireflective coating; electrodepositing a metal layer on the busbar region and the finger regions; removing the mask; and performing an anneal, wherein during the anneal metal atoms from the metal layer react with semiconductor atoms from the busbar region and the finger regions forming a metal semiconductor alloy.

11 Claims, 11 Drawing Sheets

(56) References Cited

U.S. PATENT DOCUMENTS

| | | | |
|---|---|---|---|
| 2012/0288991 A1* | 11/2012 | Abed et al. ...................... 438/98 |
| 2012/0318341 A1* | 12/2012 | Fisher et al. .................. 136/256 |
| 2012/0325316 A1* | 12/2012 | Cotte et al. .................... 136/259 |
| 2013/0014812 A1* | 1/2013 | Fisher et al. .................. 136/255 |
| 2013/0061917 A1* | 3/2013 | Huang .......................... 136/256 |
| 2013/0065345 A1* | 3/2013 | Huang ............................ 438/57 |
| 2013/0065351 A1* | 3/2013 | Baker-O'Neal et al. ........ 438/72 |
| 2013/0125968 A1* | 5/2013 | Sinha et al. ................... 136/256 |

\* cited by examiner

PROCESSES FOR UNIFORM METAL SEMICONDUCTOR ALLOY FORMATION FOR FRONT SIDE CONTACT METALLIZATION AND PHOTOVOLTAIC DEVICE FORMED THEREFROM

BACKGROUND

The present disclosure relates to photovoltaic devices and processes of manufacturing the same. More particularly, the present disclosure relates to photovoltaic devices, such as solar cells, having front side metal semiconductor alloy contacts which have a uniform thickness at edge portions as well as a central portion of each contact. The present disclosure also provides various processes for forming the same.

A photovoltaic device is a device that converts the energy of incident photons to electromotive force (e.m.f.). Typical photovoltaic devices include solar cells, which are configured to convert the energy in the electromagnetic radiation from the Sun to electric energy. Each photon has an energy given by the formula E=hv, in which the energy E is equal to the product of the Plank constant h and the frequency v of the electromagnetic radiation associated with the photon.

A photon having energy greater than the electron binding energy of a matter can interact with the matter and free an electron from the matter. While the probability of interaction of each photon with each atom is probabilistic, a structure can be built with a sufficient thickness to cause interaction of photons with the structure with high probability. When an electron is knocked off an atom by a photon, the energy of the photon is converted to electrostatic energy and kinetic energy of the electron, the atom, and/or the crystal lattice including the atom. The electron does not need to have sufficient energy to escape the ionized atom. In the case of a material having a band structure, the electron can merely make a transition to a different band in order to absorb the energy from the photon.

The positive charge of the ionized atom can remain localized on the ionized atom, or can be shared in the lattice including the atom. When the positive charge is shared by the entire lattice, thereby becoming a non-localized charge, this charge is described as a hole in a valence band of the lattice including the atom Likewise, the electron can be non-localized and shared by all atoms in the lattice. This situation occurs in a semiconductor material, and is referred to as photogeneration of an electron-hole pair. The formation of electron-hole pairs and the efficiency of photogeneration depend on the band structure of the irradiated material and the energy of the photon. In case the irradiated material is a semiconductor material, photogeneration occurs when the energy of a photon exceeds the band gap energy, i.e., the energy difference of the conduction band and valence band.

The direction of travel of charged particles, i.e., the electrons and holes, in an irradiated material is sufficiently random (known as carrier "diffusion"). Thus, in the absence of an electric field, photogeneration of electron-hole pairs merely results in heating of the irradiated material. However, an electric field can break the spatial direction of the travel of the charged particles to harness the electrons and holes formed by photogeneration.

One exemplary method of providing an electric field is to form a p-n or p-i-n junction around the irradiated material. Due to the higher potential energy of electrons (corresponding to the lower potential energy of holes) in the p-doped material with respect to the n-doped material, electrons and holes generated in the vicinity of the p-n junction will drift to the n-doped and p-doped region, respectively. Thus, the electron-hole pairs are collected systematically to provide positive charges at the p-doped region and negative charges at the n-doped region. The p-n or p-i-n junction forms the core of this type of photovoltaic device, which provides electromotive force that can power a device connected to the positive node at the p-doped region and the negative node at the n-doped region.

The majority of solar cells currently in production are based on silicon wafers with screen printed metal pastes as electrical contacts. Screen printing is attractive due to its simplicity in processing and high throughput capability; however, the high contact resistance, high paste cost, shadowing from wide conductive lines, high temperature processing, and mechanical yield loss are disadvantages that have not been overcome even after thirty plus years of research and development.

SUMMARY

The present disclosure provides processes for fabricating photovoltaic devices such as solar cells in which the front side contact metal semiconductor alloy metallization patterns have a uniform thickness at edge portions as well as a central portion of each metallization pattern. That is, the present disclosure provides processes for fabricating photovoltaic devices in which the thickness variation of the metal semiconductor alloy contact that is formed at the front side surface of a semiconductor substrate is less than 30%.

In one embodiment, a method of forming a photovoltaic device is provided that includes providing a semiconductor substrate including a p-n junction with a p-type semiconductor portion and an n-type semiconductor portion one on top of the other, wherein an upper exposed surface of one of the semiconductor portions represents a front side surface of the semiconductor substrate; forming a plurality of patterned antireflective coating layers on the front side surface of the semiconductor surface to provide a grid pattern including a busbar region and finger regions, the busbar region and the finger regions are comprised of exposed portions of the front side surface of the semiconductor substrate; overlaying a mask atop the plurality of patterned antireflective coating layers, the mask having a shape that mimics each patterned antireflective coating; electrodepositing a metal layer on the busbar region and the finger regions; removing the mask and performing an anneal, wherein during the anneal metal atoms from the metal layer react with semiconductor atoms from the busbar region and the finger regions forming a metal semiconductor alloy. In some embodiments, the above method provides a structure in which the metal semiconductor alloy within the busbar region and the finger regions has a thickness variation of less than 30%.

In one embodiment, the n-type semiconductor portion overlies the p-type semiconductor portion. In another embodiment, the p-type semiconductor portion overlies the n-type semiconductor portion.

In other embodiments, the metallization patterns are re-designed to separate the edge portions of the original pattern. The re-designed pattern includes real lines to mimic the center portions and dummy lines which mimic the edge patterns. By re-designing the pattern in the above mentioned manner, i.e., by breaking the original pattern into real center lines and dummy edge lines, the metal layer that is electroplated in the real center lines has a uniform thickness and the dummy lines can be processed further and separately from the real lines to achieve a much thinner metal layer that matches the thickness of the metal in the real lines.

In one embodiment, the re-designing process includes providing a semiconductor substrate including a p-n junction with a p-type semiconductor portion and an n-type semiconductor portion one on top of the other, wherein an upper exposed surface of one of the semiconductor portions represents a front side surface of the semiconductor substrate; forming a plurality of patterned antireflective coating layers on the front side surface of the semiconductor surface to provide a grid pattern including a busbar region and finger regions, the busbar region and the finger regions are comprised of exposed portions of the front side surface of the semiconductor substrate; forming a patterned mask within at least the busbar region to break the busbar region into a real line interposed between two dummy lines; electrodepositing a first metal layer on the real line and dummy lines; removing the first metal layer from atop the dummy lines; electrodepositing a second metal layer atop the exposed dummy lines; and performing an anneal, wherein during the anneal metal atoms from the first metal layer react with semiconductor atoms from the real line forming a first metal semiconductor alloy on the real line and wherein metal atoms from the second metal layer react with semiconductor atoms from the dummy lines forming a second metal semiconductor alloy on the dummy lines. In some embodiments, the above method provides a structure in which the first and second metal semiconductor alloys have a thickness variation of less than 30%.

In one embodiment, the n-type semiconductor portion overlies the p-type semiconductor portion. In another embodiment, the p-type semiconductor portion overlies the n-type semiconductor portion.

In one embodiment, a protective material can be formed atop the first metal layer that is formed on the real lines. In some embodiments, the protective material remains atop the first metal layer during the annealing step. In another embodiment, the protective material can be removed from atop the first metal layer after removing the first metal layer from the dummy lines.

In another embodiment, the dummy lines can be surface treated to form a surface layer on the dummy lines that is resistant to formation of a metal semiconductor alloy.

In yet another embodiment, the re-designing process includes providing a semiconductor substrate including a p-n junction with a p-type semiconductor portion and an n-type semiconductor portion one on top of the other, wherein an upper exposed surface of one of the semiconductor portions represents a front side surface of the semiconductor substrate; forming a plurality of patterned antireflective coating layers on the front side surface of the semiconductor surface to provide a grid pattern including a busbar region and finger regions, the busbar region and the finger regions are comprised of exposed portions of the front side surface of the semiconductor substrate; forming a patterned mask within at least the busbar region to break the busbar region into a real line interposed between two dummy lines; electrodepositing a sacrificial metal layer on the real line and dummy lines, wherein the sacrificial metal layer on the real line is discontinuous and wherein the sacrificial metal layer on the dummy lines is continuous; electrodepositing a first metal layer atop the real lines and atop the dummy lines, wherein the sacrificial metal layer in the dummy lines separates the first metal layer from the dummy lines; performing an anneal, wherein during the anneal metal atoms from the first metal layer react with semiconductor atoms from the real line forming a first metal semiconductor alloy; removing the first metal layer and the sacrificial metal layer from atop the dummy lines; electrodepositing a second metal layer atop the exposed dummy lines; and performing another anneal, wherein during the another anneal metal atoms from the second metal layer react with semiconductor atoms from the dummy lines forming a second metal semiconductor alloy. In some embodiments, the above method provides a structure in which the first and second metal semiconductor alloys have a thickness variation of less than 30%.

In one embodiment, the n-type semiconductor portion overlies the p-type semiconductor portion. In another embodiment, the p-type semiconductor portion overlies the n-type semiconductor portion.

The present disclosure also provides a photovoltaic device that can be formed by at least one of the above mentioned methods. Specifically, the photovoltaic device of the present disclosure includes a semiconductor substrate including a p-n junction with a p-type semiconductor portion and an n-type semiconductor portion one lying on top of the other, wherein an upper exposed surface of the semiconductor substrate represents a front side surface of the semiconductor substrate. The photovoltaic device of the present disclosure further includes a plurality of patterned antireflective coatings located on the front side surface of the semiconductor substrate to provide a grid pattern including a busbar region and finger regions, wherein the busbar region comprises at least a real line interposed between at least two dummy lines. The photovoltaic device also includes a material stack comprising at least one metal layer located on the semiconductor substrate in the busbar region and the finger regions.

DETAILED DESCRIPTION

The present disclosure, which provides photovoltaic devices, such as solar cells, having front side contact metal semiconductor alloy metallization patterns which have a uniform thickness at edge portions as well as a central portion of each metallization pattern and processes of forming the same, will now be described in greater detail by referring to the following discussion and drawings that accompany the present application. It is observed that the drawings of the present application are provided for illustrative proposes and, as such, the drawings are not drawn to scale.

In the following description, numerous specific details are set forth, such as particular structures, components, materials, dimensions, processing steps and techniques, in order to provide an understanding of some aspects of the present disclosure. However, it will be appreciated by one of ordinary skill in the art that the various embodiments of the disclosure may be practiced without these specific details. In other instances, well-known structures or processing steps have not been described in detail in order to avoid obscuring the various embodiments of the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
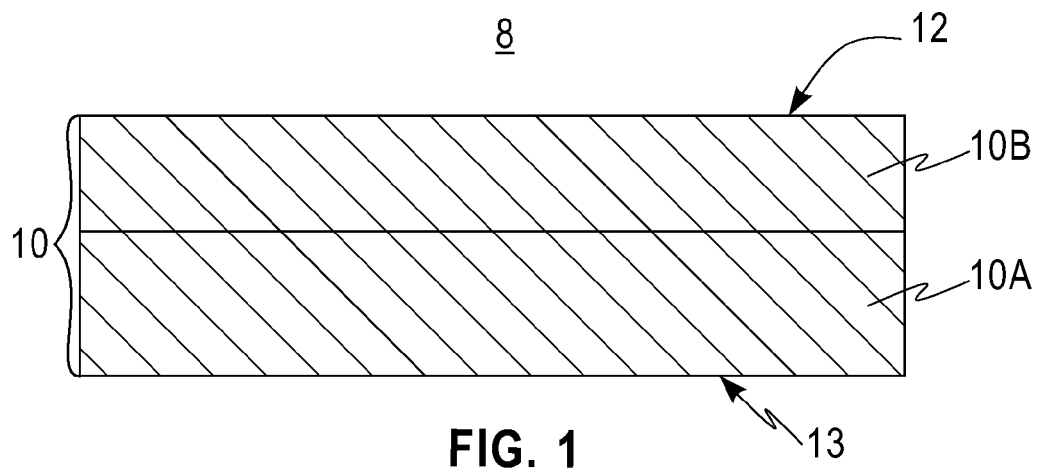
FIG. 1 is a pictorial representation (through a cross sectional view) illustrating an initial structure that can be employed in one embodiment of the present disclosure.

Referring now to FIG. 1, there is illustrated an initial structure 8 that can be employed in one embodiment of the present disclosure. The initial structure 8 includes a semiconductor substrate 10 having a front side surface 12 and a back side surface 13 that is opposite the front side surface 12.

The semiconductor substrate 10 can comprise any semiconductor material including, but not limited to, Si, Ge, SiGe, SiC, SiGeC, GaAs, GaN, InAs, InP, CdTe, CuInSe$_2$, Cu(InGa)Se$_2$, and all other III/V, II/VI, or I/III/VI compound semiconductors. In one embodiment of the present disclosure, the semiconductor substrate 10 is comprised of Si. In another embodiment, the semiconductor substrate 10 is comprised of a single crystalline semiconductor material. In another embodiment, the semiconductor substrate 10 is comprised of a multicrystalline semiconductor material. In yet another embodiment, the semiconductor substrate 10 is comprised of multiple layers of different semiconductor materials, for example, with different energy band gaps.

The semiconductor substrate 10 illustrated in FIG. 1 includes a p-type semiconductor portion 10A that includes a p-type dopant, and an n-type semiconductor portion 10B that includes an n-type dopant. In FIG. 1, the n-type semiconductor portion 10B overlies the p-type semiconductor portion 10A. In some embodiments (not shown), the p-type semiconductor portion of the substrate overlies the n-type semiconductor portion. In such an embodiment, the order of layers 10A and 10B would be reversed from that shown, i.e., layer 10A would be located atop layer 10B. Also, in such an embodiment, an exposed surface of layer 10A would be used as the front side surface of the semiconductor substrate 10.

The term "n-type dopant" is used throughout the present disclosure to denote an atom from Group VA of the Periodic Table of Elements including, for example, P, As and/or Sb. The term "p-type dopant" is used throughout the present disclosure to denote an atom from Group IIIA of the Periodic Table of Elements including, for example, B, Al, Ga and/or In.

The concentration of dopant within the semiconductor material may vary depending on the ultimate end use of the semiconductor material and the type of dopant atom being employed. The p-type semiconductor portion 10A of the semiconductor substrate 10 typically has a p-type dopant concentration from 1e15 atoms/cm$^3$ to 1e17 atoms/cm$^3$, with a p-type dopant concentration from 5e15 atoms/cm$^3$ to 5e16 atoms/cm$^3$ being more typical. The n-type semiconductor portion 10B of the semiconductor substrate 10 typically has an n-type dopant concentration from 1e16 atoms/cm$^3$ to 1e22 atoms/cm$^3$, with an n-type dopant concentration from 1e19 atoms/cm$^3$ to 1e21 atoms/cm$^3$ being more typical. The sheet resistance of the n-type semiconductor portion 10B is typically greater than 50 ohm/sq, with a sheet resistance range of the n-type semiconductor portion 10B from 60 ohm/sq to 200 ohm/sq being more typical.

The dopant (n-type and/or p-type) can be introduced into an initial doped or undoped semiconductor material using techniques well known to those skilled. For example, the n-type and/or p-type dopant can be introduced into the semiconductor material by ion implantation, gas phase doping, liquid solution spray/mist doping, and/or out-diffusion of a dopant atom from an overlying sacrificial dopant material layer that can be formed on the substrate, and removed after the out-diffusion process. In some embodiments of the present disclosure, the dopant(s) can be introduced into the semiconductor substrate 10 during the formation thereof. For example, an in-situ epitaxial growth process can be used to form a doped semiconductor substrate 10.

The front side surface 12 of the semiconductor substrate 10 may be non-textured or textured. A textured (i.e., specially roughened) surface is used in solar cell applications to increase the efficiency of light absorption. The textured surface decreases the fraction of incident light lost to reflection relative to the fraction of incident light transmitted into the cell since photons incident on the side of an angled feature will be reflected onto the sides of adjacent angled features and thus have another chance to be absorbed. Moreover, the textured surface increases internal absorption, since light incident on an angled silicon surface will typically be deflected to propagate through the substrate at an oblique angle, thereby increasing the length of the path taken to reach the substrate's back surface, as well as making it more likely that photons reflected from the substrate back surface will impinge on the front surface at angles compatible with total internal reflection and light trapping. The texturing of the front side surface 12 of the semiconductor substrate 10 can be performed utilizing conventional techniques well known in the art. In one embodiment, a KOH based solution can be used to texture the front side surface 12 of the single crystalline silicon semiconductor substrate 10. In another embodiment, a HNO$_3$/HF solution can be used to texture a multicrystalline silicon wafer surface. In yet another embodiment, texturing can be achieved by utilizing a combination of reactive ion etching (RIE) and a mask comprising closely packed self-assembled polymer spheres.

Although the following drawings and description illustrate processing the n-type semiconductor portion 10B of the semiconductor substrate 10, the following description can also be applied to processing the p-type semiconductor portion of the semiconductor substrate 10 in embodiments in which the p-type semiconductor portion is located atop the n-type semiconductor portion.

Figure 2A:
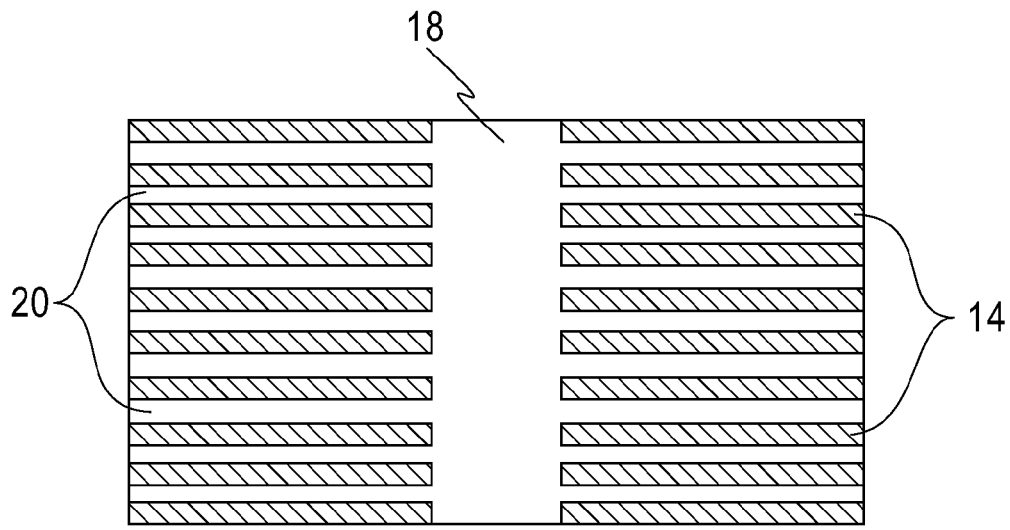
FIGS. 2A-2B are pictorial representations (through a top down view and cross sectional view, respectively) illustrating the structure of FIG. 1 after patterning a front side surface of the initial structure utilizing a plurality of patterned antireflective coating layers as a pattern mask.
Figure 2B:
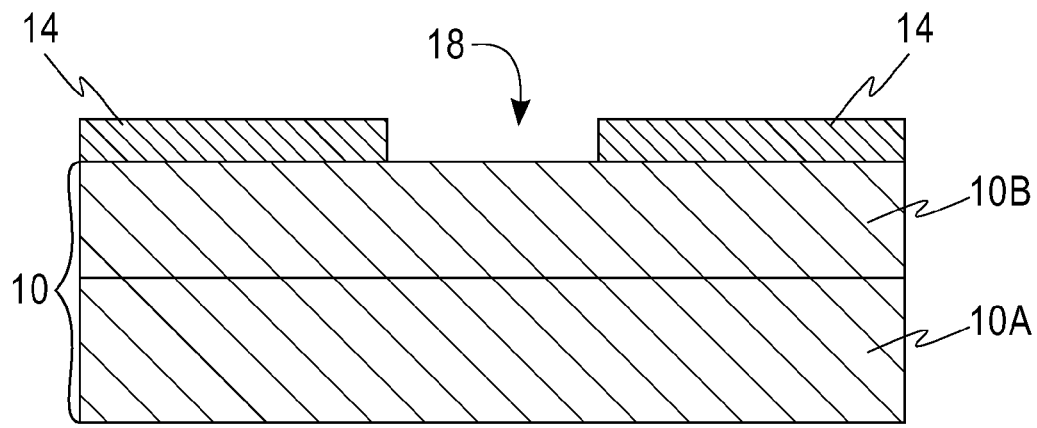

Referring now to FIGS. 2A-2B, there is illustrated the structure that is formed after patterning the front side surface 12 of n-type semiconductor portion 10B of the semiconductor substrate 10 shown in FIG. 1 utilizing a plurality of patterned antireflective coating (ARC) layers 14 as a pattern mask. As shown, the plurality of patterned ARC layers 14 covers areas of the underlying n-type semiconductor portion 10B of the semiconductor substrate 10, while leaving other areas of the n-type semiconductor portion 10B of the semiconductor substrate 10 exposed. The exposed areas of the n-type semiconductor portion 10B of the semiconductor substrate 10 have a grid pattern which includes a single wide, central exposed strip (hereinafter busbar region 18) and narrow strips (hereinafter finger regions 20) which run perpendicular to the busbar region 18.

Each patterned ARC layer 14 that can be employed in the present disclosure includes a conventional ARC material such as, for example, an inorganic ARC or an organic ARC. In one embodiment of the present disclosure, the ARC material comprises silicon nitride. The patterned ARC layers 14 can be formed utilizing techniques well known to those skilled in the art. For example, an ARC composition can be applied to the front side surface 12 of the semiconductor substrate 10 (i.e., directly onto the exposed upper surface of the n-type semiconductor portion 10B) utilizing a conventional deposition process including, for example, spin-on coating, dip coating, evaporation, chemical solution deposition, chemical vapor deposition (CVD), and plasma enhanced chemical vapor deposition (PECVD). After application of the ARC composition, particularly those from a liquid phase, a post deposition baking step is usually employed to remove unwanted components, such as solvent, and to effect crosslinking. The post deposition baking step of the ARC composition is typically, but not necessarily always, performed at a temperature from 80° C. to 300° C., with a baking temperature from 120° C. to 200° C. being more typical.

In some embodiments, the as-deposited ARC composition may be subjected to a post deposition treatment to improve the properties of the entire layer or the surface of the ARC. This post deposition treatment can be selected from heat treatment, irradiation of electromagnetic wave (such as ultraviolet light), particle beam (such as an electron beam, or an ion beam), plasma treatment, chemical treatment through a gas phase or a liquid phase (such as application of a monolayer of surface modifier) or any combination thereof. This post-deposition treatment can be blanket or pattern-wise.

The applied ARC composition can be patterned utilizing lithography and etching. The lithographic process includes applying a photoresist (not shown) to an upper surface of the as-deposited ARC composition, exposing the photoresist to a desired pattern of radiation and developing the exposed photoresist utilizing a conventional resist developer. A patterned photoresist is thus provided. The pattern in the photoresist is transferred to the as-deposited ARC composition utilizing an etching process such as, for example, dry etching or chemical wet etching. After transferring the pattern from the patterned photoresist to the underlying as-deposited ARC composition, the patterned photoresist is typically removed from the structure utilizing a conventional resist stripping process such as, for example, ashing. In another embodiment, the ARC layer can be patterned utilizing ink jet printing or laser ablation. In yet another embodiment, the exposed front side surface 12 of semiconductor substrate 10 in the patterned region of ARC 14 can be further treated to increase the doping level. In these cases, the top semiconductor portion is thicker or has a higher dopant concentration under the exposed region.

If a conventional light inducing plating process was now employed to the structure illustrated in FIGS. 2A-2B, the amount of metal that would be plated would have a large variation in thickness which is greater at edges of busbar region 18 and the finger regions 20 of the structure that abut each patterned ARC layer 14 as compared with a central portion of the busbar region 18 and the finger regions 20. The large variation in metal thickness would lead to a metal semiconductor alloy that also has the same large variation in thickness. The reason for this thickness variation includes the patterned effect of the plated area which results in higher current at the edges of the pattern as compared with the center of the pattern. Another possible reason for the variation in thickness is due to the crowding of photon generated electrons at the edges of the pattern.

In one embodiment of the present disclosure, the aforementioned variation of plated metal thickness can be substantially eliminated by providing a mask 22 that mimics the shape of each of the patterned ARC layers 14 and placing the mask 22 atop the structure illustrated in FIGS. 2A-2B. The resultant structure including the mask 22 is shown, for example, in FIGS. 3A-3B. In one embodiment, the mask 22 completely covers each of the patterned ARC layers 14. In another embodiment, the mask 22 does not completely cover edge portions of each patterned ARC layer 14. The former embodiment is depicted in FIGS. 3A-3B of the present application.

In one embodiment, the mask 22 can be comprised of any metallic material including, for example, Ni, Al, Cu, W, Fe, Co, Ir, and alloys thereof. In another embodiment, the mask 22 is comprised of stainless steel. In yet another embodiment, the mask 22 can be comprised of any nonmetallic conductive material, for example, indium tin oxide, and doped zinc oxide. The mask 22 can be formed utilizing lithography and etching as described above for patterning the ARC composition.

Figure 3A:
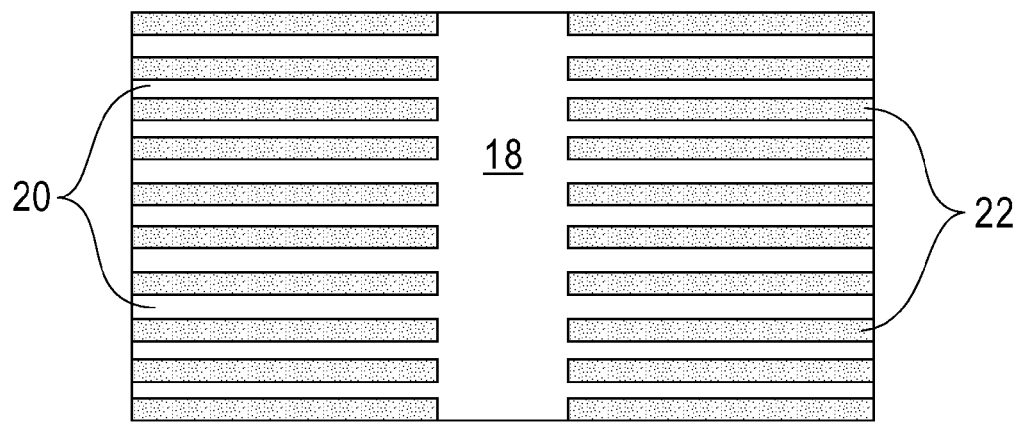
FIGS. 3A-3B are pictorial representations (through a top down view and cross sectional view, respectively) illustrating the structure of FIGS. 2A-2B) after applying a mask that mimics the shape of the plurality of patterned antireflective coating layers.
Figure 3B:
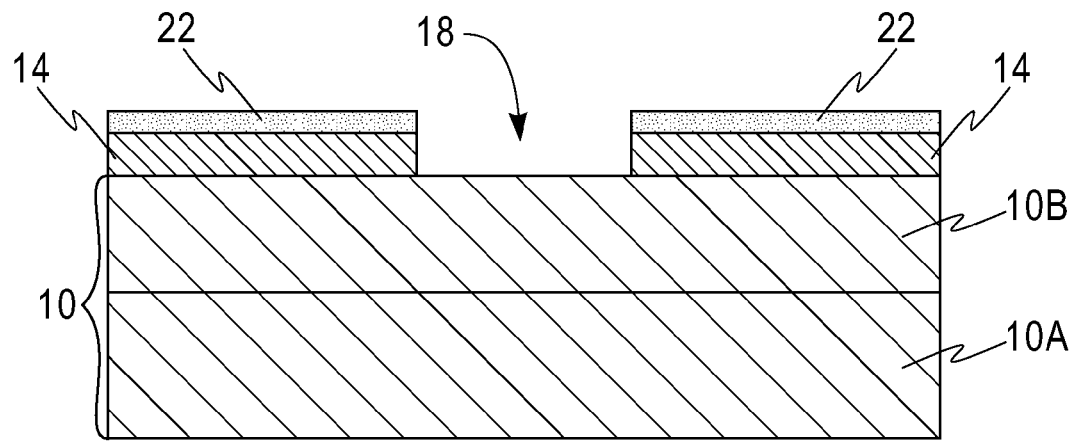
Figure 4A:
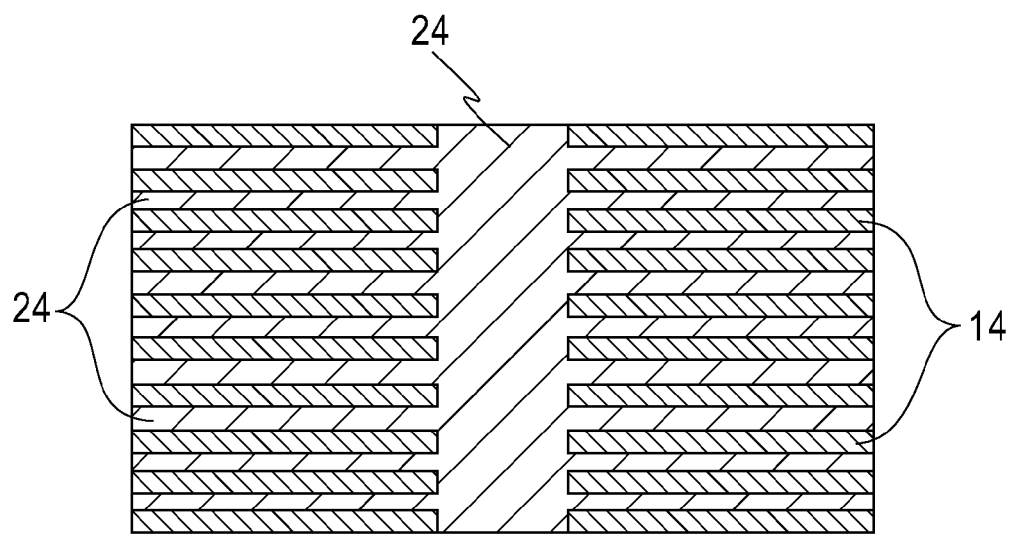
FIGS. 4A-4B are pictorial representations (through a top down and cross sectional view, respectively) illustrating the structure of FIGS. 3A-3B after forming a metal layer on the structure by electrodeposition, i.e., electroplating, and removing the mask.
Figure 4B:
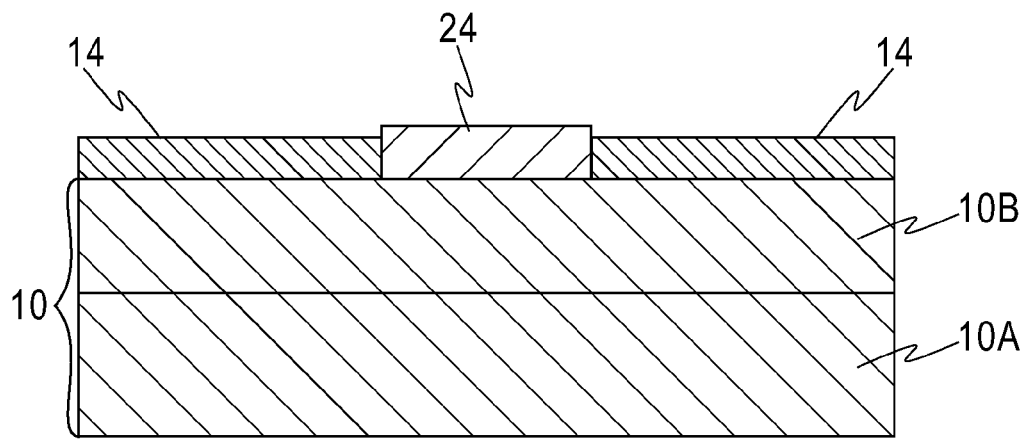

Referring now to FIGS. 4A-4B, there is illustrated the structure of FIGS. 3A-3B after forming a metal layer 24 on the structure by electrodeposition, i.e., electroplating, and subsequent removal of the mask 22. In this embodiment, the mask 22 serves as a current thief and provides a means for electrodepositing a metal layer 24 that has a uniform thickness (i.e., the ratio of the thickness at the edge portion and the thickness at the center portion is less than 4) on the exposed portions of the semiconductor substrate 10.

The metal layer 24 that is formed may comprise any metal or metal alloy. In one embodiment of the present application, the metal layer 24 is comprised of Ni, Co, Cu, Zn, Pt, Ag, Pd, Sn, Fe, In or alloys thereof. In another embodiment, the metal layer 24 is comprised of Ni, Co, Cu, Zn, Pt, Fe or alloys thereof. In a further embodiment of the present invention, the metal layer 24 is comprised of Ni or a Ni alloy.

In some embodiments, and prior to the electrodeposition of metal layer 24, the exposed surface(s) of the front side surface of the semiconductor material 10 can be cleaned using a conventional cleaning process that is well known to those skilled in the art which is capable of removing surface oxides and other contaminants from the exposed surface(s) of the semiconductor material. For example, a diluted HF solution can be used to clean the exposed front side surface of the semiconductor substrate 10.

The electrodeposition method of the present application includes the use of any conventional electroplating apparatus that is well known to those skilled in the art. Electrodeposition, i.e., electroplating, is a plating process in which metal ions in a solution are moved by an electric field to coat an electrode. The process uses electrical current to reduce cations of a desired material from a solution and coat a conductive object with a thin layer of the material, such as a metal. In electrodeposition, i.e., electroplating, the part to be plated is the cathode of the circuit. In the current disclosure, the busbar region 18 and the finger regions 20 are employed as the cathode of the circuit. The anode that is employed in the electrodeposition process may or may not be made of the same metal as to be plated. In the present disclosure, the structure shown in FIGS. 3A-3B is immersed in an electroplating bath (e.g., an electrolyte) containing an anode and one or more dissolved metal salts (to be further defined here below) as well as other ions that permit the flow of electricity. A power supply supplies a direct current to the anode and plating occurs at the cathode (i.e., the busbar region 18 and the finger regions 20).

The electroplating bath that can be employed in the present disclosure includes one or more sources of metal ions, to plate metals. The one or more sources of metal ions provide metal ions which include, but are not limited to, Ni, Co, Cu, Zn, Pt, Ag, Pd, Sn, Fe and In. Alloys that can be electrodeposited (or plated) include, but are not limited to, binary and ternary alloys of the foregoing metals. In one embodiment, metals chosen from Ni, Co, Cu, Zn, Pt and Fe are plated from the electroplating bath. In another embodiment, Ni or a Ni alloy is plated from the electroplating bath.

The one or more sources of metal ions that can be present in the electroplating bath include metal salts. The metal salts that can be used include, but are not limited to, metal halides, metal nitrates, metal sulfates, metal sulfamates, metal alkane sulfonates, metal alkanol sulfonate, metal pyrophosphates, metal cyanides, metal acetates or metal citrates.

Some of the various types of metal salts that can be employed in the present disclosure are now described in greater detail. Copper (Cu) salts which may be used in the electroplating bath include, but are not limited to, one or more of copper halides, copper sulfates, copper phosphates, copper acetates, and copper citrate. Typically, copper sulfate, copper phosphates, or copper citrates, or mixtures thereof are used in the electroplating bath.

Tin (Sn) salts which may be used in the electroplating bath include, but are not limited to, one or more of tin sulfates, tin halides, tin alkane sulfonates such as tin methane sulfonate, tin ethane sulfonate, and tin propane sulfonate, tin aryl sulfonate such as tin phenyl sulfonate and tin toluene sulfonate, and tin alkanol sulfonate. Typically, tin sulfate or tin alkane sulfonate is used in the electroplating bath.

Gold (Au) salts which may be used in the electroplating bath include, but are not limited to, one or more of gold trichloride, gold tribromide, gold cyanide, potassium gold chloride, potassium gold cyanide, sodium gold chloride and sodium gold cyanide.

Silver (Ag) salts which may be used in the electroplating bath include, but are not limited to, one or more of silver nitrate, silver chloride, silver acetate and silver bromate. Typically, silver nitrate is used in the electroplating bath.

Nickel (Ni) salts which may be used in the electroplating bath include, but are not limited to, one or more of nickel chloride, nickel sulfamate, nickel acetate, nickel ammonium sulfate, nickel methane sulfonate, nickel pyrophosphate, and nickel sulfate.

Palladium (Pd) salts which may be used in the electroplating bath include, but are not limited to, one or more of palladium chloride, palladium nitrate, palladium potassium chloride and sodium chloropalladate.

Platinum (Pt) salts which may be use include, but are not limited to, one or more of platinum tetrachloride, platinum sulfate and sodium chloroplatinate.

Indium (In) salts which may be used include, but are not limited to, one or more of indium salts of alkane sulfonic acids and aromatic sulfonic acids, such as methanesulfonic acid, ethanesulfonic acid, butane sulfonic acid, benzenesulfonic acid and toluenesulfonic acid, salts of sulfamic acid, sulfate salts, chloride and bromide salts of indium, nitrate salts, hydroxide salts, indium oxides, fluoroborate salts, indium salts of carboxylic acids, such as citric acid, acetoacetic acid, glyoxylic acid, pyruvic acid, glycolic acid, malonic acid, hydroxamic acid, iminodiacetic acid, salicylic acid, glyceric acid, succinic acid, malic acid, tartaric acid, hydroxybutyric acid, indium salts of amino acids, such as arginine, aspartic acid, asparagine, glutamic acid, glycine, glutamine, leucine, lysine, threonine, isoleucine, and valine.

Sources of cobalt (Co) ions include, but are not limited to, one or more of cobalt ammonium sulfate, cobalt acetate, cobalt sulfate, cobalt sulfamate, cobalt methane sulfonate, cobalt pyrophosphate, and cobalt chloride. Sources of zinc (Zn) ions include, but are not limited to, one or more of zinc bromate, zinc chloride, zinc nitrate and zinc sulfate. Source of iron (Fe) include, but are not limited to, one or more of ferric or ferrous chloride, iron nitrate, iron sulfate, iron acetate, and iron sulfate.

In general, the metal salts are included in the electroplating bath such that metal ions range in concentrations from 0.001 mole/L to 2 mole/L, or such as from 0.005 mole/L to 1.5 mole/L. Typically, metal salts are included in amount such that metal ion concentration range from 0.01 to 1.5 mole/L, more typically from 0.1 mole/L to 1 mole/L.

The electroplating bath that can be used may include one or more conventional diluents. Typically, the electroplating bath is aqueous; however, conventional organic diluents may be used if desired. Optional conventional electroplating bath additives also may be included. Such additives include, but are not limited to, one or more of brighteners, suppressors, surfactants, inorganic acids, organic acids, brightener breakdown inhibition compounds, alkali metal salts, and pH adjusting compounds.

Suppressors include, but are not limited to, one or more of oxygen containing high molecular weight compounds such as carboxymethylcellulose, nonylphenolpolyglycol ether, octandiolbis-(polyalkylene glycolether), octanolpolyalkylene glycolether, oleic acidpolyglycol ester, poly alkylene glycol, polyethylene glycoldimethylether, polyoxypropylene glycol, polypropylene glycol, polyvinylalcohol, poly alkylene imine, stearic acidpolyglycol ester, and stearyl alcohol-polyglycol ether. Typically poly(alkoxylated)glycols are used. Such suppressors may be included in the electroplating bath in conventional amounts, such as from 0.01 g/L to 10 g/L, or such as from 0.05 g/l to 0.5 g/L.

One or more conventional surfactants may be used. Typically, surfactants include, but are not limited to, ionic surfactant such as alkylsulfonate and nonionic surfactants such as alkyl phenoxy polyethoxyethanols. Other suitable surfactants containing multiple oxyethylene groups also may be used. Such surfactants include compounds of polyoxyethylene polymers having from as many as 20 to 7500 repeating units. Such compounds also may perform as suppressors. Also included in the class of polymers are both block and random copolymers of polyoxyethylene (EO) and polyoxypropylene (PO). Surfactants may be added in conventional amounts, as from 0.05 g/L to 20 g/L, or such as from 0.1 g/L to 10 g/L.

Conventional levelers include, but are not limited to, one or more of alkylated polyalkyleneimines, oxygen containing organic compounds, and organic sulfonates. Examples of such compounds include 1-(2-hydroxyethyl)-2-imidazolidinethione (HIT), 4-mercaptopyridine, 2-mercaptothiazoline, ethylene thiourea, thiourea, saccharin, coumarin, 1-(2-hydroxyethyl)-2-imidazolidinethione (HIT) and alkylated polyalkyleneimines. Such levelers are included in conventional amounts. Typically, such levelers are included in amounts of 1 ppb to 1 g/L, or such as from 10 ppb to 500 ppm.

One or more inorganic and organic acids can be also included in the electroplating bath to increase the solution conductivity of the matrix and also to adjust the pH of the plating composition. Inorganic acids include, but are not limited to, sulfuric acid, hydrochloric acid, nitric acid and phosphoric acid. Organic acids include, but are not limited to, alkane sulfonic acids, such a methane sulfonic acid. Acids are included in the electroplating bath in conventional amounts.

Alkali metal salts which may be included in the electroplating bath include, but are not limited to, sodium and potassium salts of halogens, such as chloride, fluoride and bromide. Typically chloride is used. Such alkali metal salts are used in conventional amounts.

In addition to the above, the electroplating bath may also include hardeners, malleability, ductility and deposition modifiers, and the like.

The measured pH of the electroplating bath may range from −1 to 14, or such as from −1 to 8. Typically, the pH of the electroplating bath ranges from −1 to 5, more typically, from 0 to 4. Conventional buffering compounds may be included to control the pH of the electroplating bath.

The electroplating baths are typically maintained in a temperature range of from 20° C. to 110° C., with a temperature from 20° C. to 50° C. being more typical. Plating temperatures may vary depending on the metal to be plated.

The electrodeposition process employed in forming the metal layers uses current waveforms that are well known to those skilled in the art. In one embodiment, the current waveform can include a high current density initially, and after a predetermined period of time, the current density can be decreased to a lower current density. In another embodiment, the current waveform can include a low current density initially, and after a predetermined period of time, the current density can be increased to a higher current density. In yet another embodiment, a single waveform can be employed to plate the metal layer 24.

By "low current density" it is meant a plating density within a range from 1 mAmps/cm$^2$ to 40 mAmps/cm$^2$. By "high current density" it is meant a plating density of greater than 20 mAmps/cm$^2$. A general range for the high current density regime is from greater than 20 mAmps/cm$^2$ to 200 mAmps/cm$^2$.

The increase from the low current density regime to the high current density regime or decrease from the high current density regime to the low current density regime may include a continuous ramp or it may include various ramp and soak cycles including a sequence of constant current plateaus.

In some embodiments of the present disclosure, the current waveform applied to the exposed semiconductor surface, including the busbar region 18 and figure regions 20, can be the same as the current waveform applied to the mask 22. In another embodiment, the current waveform applied to the exposed semiconductor surface, including the busbar region 18 and figure regions 20, has the same waveform shape as, but lower current density value than, the current waveform applied to the mask 22.

In some embodiments of the present disclosure, light illumination can be used during the electrodeposition process. In particular, light illumination can be used in embodiments in which solar or photovoltaic cells are to be fabricated to generate free electrons that can be used during the electrodeposition process. When light illumination is employed during the electrodeposition process, any conventional light source or light emitting diodes can be used. The intensity of the light employed may vary and is typically greater than 50 W/m$^2$, with an intensity of light from 100 W/m$^2$ to 500 W/m$^2$ being more typical. The combination of the aforementioned waveform and light illumination enables one to provide complete coverage of a metallic film on the surface of a semiconductor substrate used in solar cell applications.

The thickness of the metal layer 24 that is electrodeposited may vary depending on the type of metal being electrodeposition, the type of electroplating bath employed as well as the current waveform and the duration of the electrodeposition process itself. Typically, the metal layer 24 that is formed has a thickness from 10 nm to 5000 nm, with a thickness from 50 nm to 500 nm being more typical. Because of the presence of the mask 22 during the electrodeposition process, the metal layer 24 has a uniform thickness (i.e., the ratio of the thickness at the edge portion and the thickness at the center portion is less than 4) across the busbar region 18 and finger regions 20.

Figure 5A:
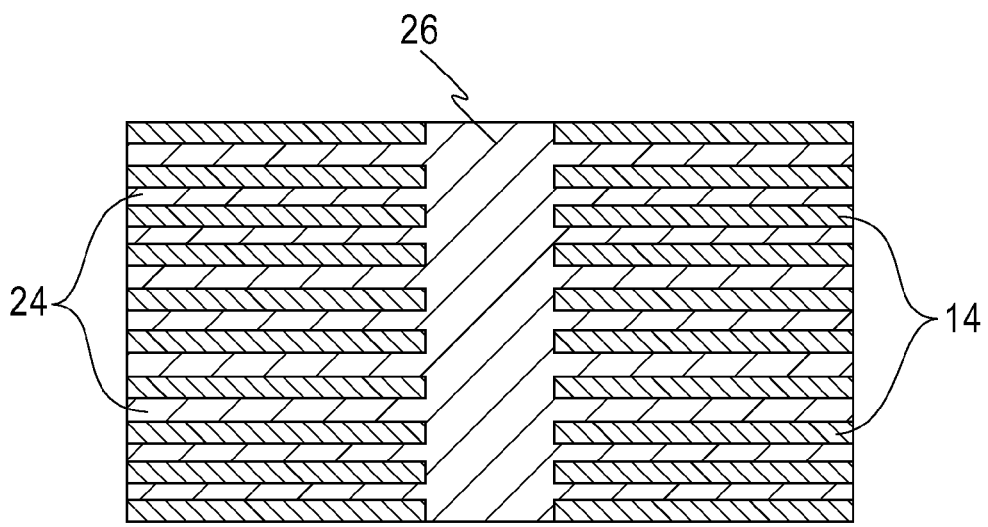
FIGS. 5A-5B are pictorial representations (through a top down and cross sectional view, respectively) illustrating the structure of FIGS. 4A-4B after performing an anneal that causes reaction between the metal layer and the underlying semiconductor layer forming a metal semiconductor alloy layer having a uniform thickness.
Figure 5B:
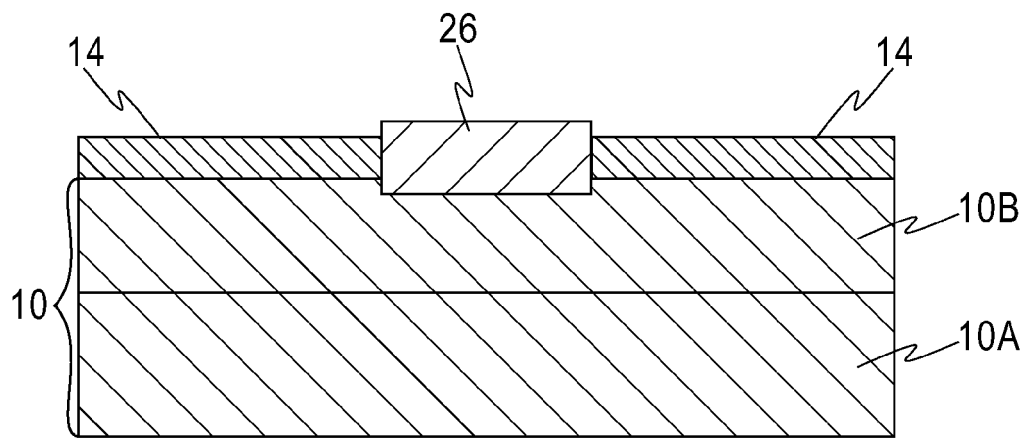

Referring now to FIGS. 5A-5B, there is illustrated the structure of FIGS. 4A-4B after performing an anneal that causes reaction between the metal layer 24 and the underlying semiconductor layer, i.e., n-type semiconductor portion 10B, forming a metal semiconductor alloy layer 26 having a uniform thickness, and optionally removing the unreacted metal layer 24 after the anneal if it does not fully react with the semiconductor portion 10B. Particularly, the metal semiconductor alloy layers are formed by reacting metal atoms from an overlying metal layer with semiconductor atoms that are present in the underlying semiconductor material. By "uniform thickness" it is meant that the metal semiconductor alloy layer 26 has a thickness variation across the entire plated surface that is less than 30%.

In one embodiment, and when the n-type semiconductor portion 10B of the semiconductor substrate 10 comprises silicon, the anneal forms a metal silicide layer. In another embodiment, and when the n-type semiconductor portion 10B of the semiconductor substrate 10 comprises germanium, the anneal forms a metal germanide layer.

The anneal may be performed in a single step or a multi-step anneal process can be used. In one embodiment, the anneal is performed at a temperature of from 250° C. or greater. In another embodiment, the anneal is performed at a temperature from 400° C. to 700° C. Annealing can be performed in air, forming gas, He, Ar, or N$_2$. The anneal includes a furnace anneal, a rapid thermal anneal, a spike anneal, a microwave anneal or a laser anneal. Typically, the anneal is a rapid thermal anneal or a belt furnace anneal in which the anneal time is about typically less than 5 minutes. Following the final anneal step, any unreacted metal layer 24 is removed from the structure utilizing an etching process that selectively removes the unreacted metal from the structure.

In addition to the above embodiment in which a mask 22 is employed as a current thief, the following embodiments re-design the metallization patterns to separate the edge portions and the center portions of the original pattern. The re-designed pattern includes real lines to mimic the center portions and dummy lines which mimic the edge patterns. By re-designing the pattern in the above mentioned manner, i.e., by breaking the original pattern into real center lines and dummy edge lines, the metal layer that is electroplated in the real lines has a uniform thickness and the dummy lines can be processed further and separately from the real lines to achieve a much thinner metal layer that matches the thickness of the metal in the real lines.

Again although the following drawings and description illustrate processing the n-type semiconductor portion 10B of the semiconductor substrate 10, the following description can also be applied to processing the p-type semiconductor portion of the semiconductor substrate 10 in embodiments in which the p-type semiconductor portion is located atop the n-type semiconductor portion.

Figure 6:
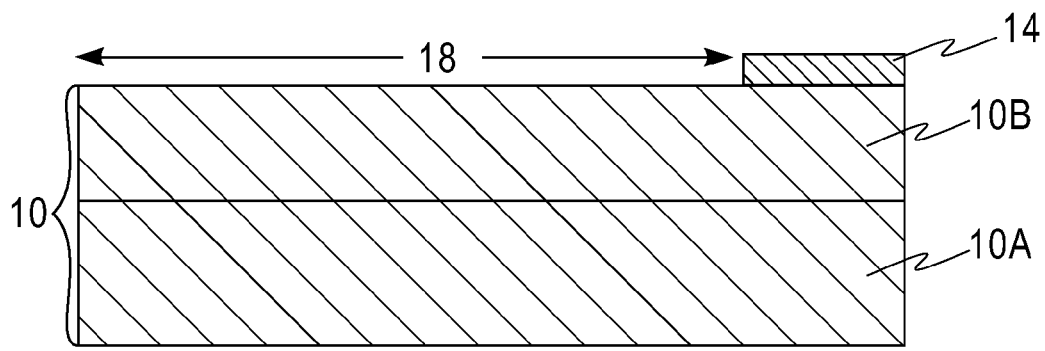
FIG. 6 is a pictorial representation (through a cross sectional view) illustrating a close up view of a portion the structure shown in FIG. 2B of the present application.

Referring now to FIG. 6, there is illustrated a close up view of a portion the structure shown in FIG. 2B of the present application. The structure shown in FIG. 6 includes semiconductor substrate 10 having a p-type semiconductor portion 10A and an overlying n-type semiconductor portion 10B and overlying patterned ARC layers 14. The structure also includes busbar region 18; the finger regions are not illustrated in the cross sectional view, but are present in front of and behind the patterned ARC layer 14 shown in FIG. 6. The structure shown in FIG. 6 is made using the same procedure as mentioned above for forming the structure shown in FIGS. 2A and 2B.

Figure 7A:
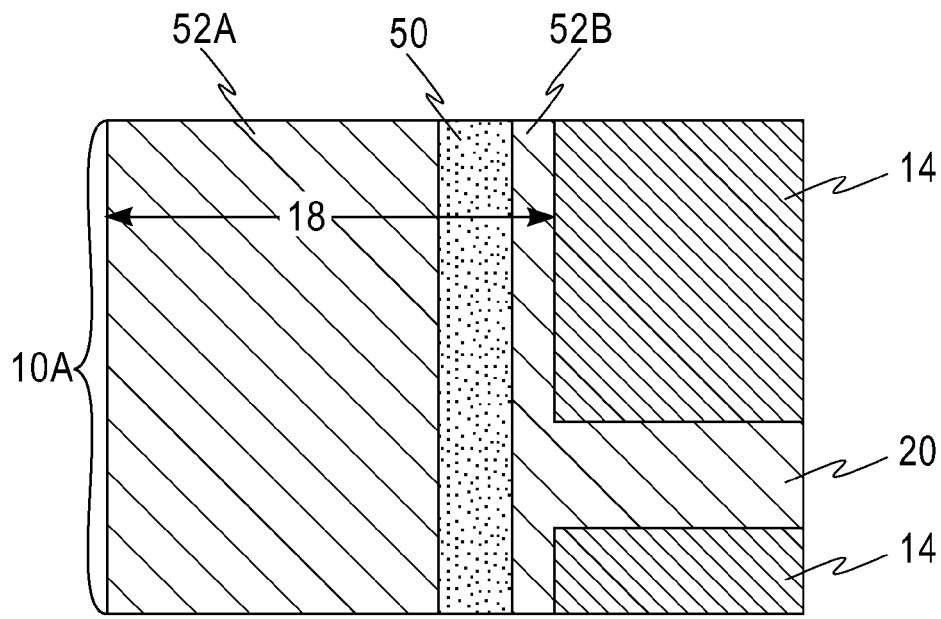
FIGS. 7A-7B are pictorial representations (through a top down and cross sectional view, respectively) illustrating the structure of FIG. 6 after breaking up the initial pattern to include a real line and dummy lines in the busbar region of the structure.
Figure 7B:
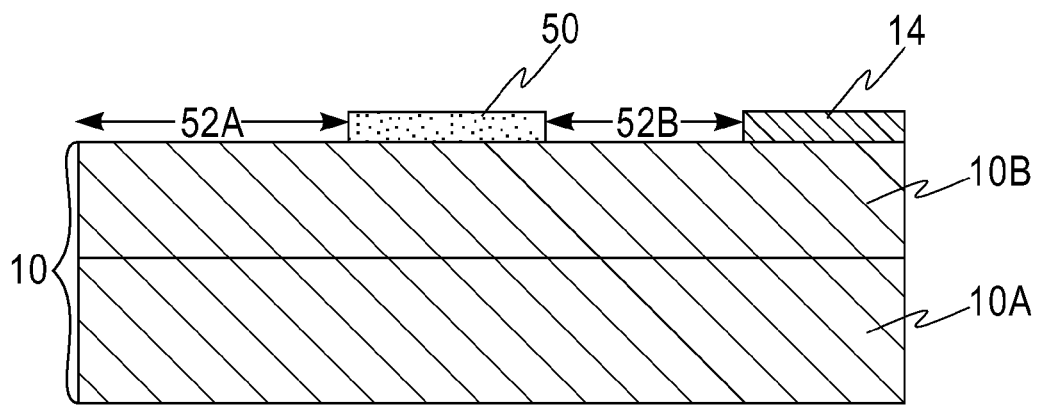

Next and as shown in FIGS. 7A-7B, a patterned mask 50 is formed on the exposed portion of the n-type semiconductor portion 10B so as to break the initial pattern of the structure into a real line 52A interposed between two dummy lines 52B; in the drawings one dummy line is shown since the other dummy line would be located to the far left hand side of the drawing. The real line 52A, which is comprised of exposed portion of the n-type semiconductor portion 10B of semiconductor substrate 10, is located at the center of at least the busbar region 18 of the structure. The dummy lines, which are also comprised of exposed portions of the n-type semiconductor portion 10B of semiconductor substrate 10, are located near the edges of the pattern, i.e., near the patterned ARC layers 14, in at least the busbar region 18 of the structure. In some embodiments, the real lines and dummy lines can be formed in the finger regions 20 of the structure as well.

The patterned mask 50 may be comprised of one of the materials mentioned above for patterned ARC layers 14. In one embodiment, the patterned mask 50 is composed of the same material as patterned ARC layers 14. In another embodiment, the patterned mask 50 is composed of a different material as patterned ARC layers 14. The patterned mask 50 can be formed utilizing the same techniques as mentioned above in forming the patterned ARC layers 14.

In some embodiments, dummy lines 52B are formed only in the busbar region 18 of the n-type semiconductor portion 10B of semiconductor substrate 10. See FIGS. 7A-7B. In another embodiment, a real line 52A and dummy lines 52B are needed for the finger regions 20 of the patterned structure as well. See FIG. 7C.

In the structure shown in FIG. 6, the width, $w_1$, of the busbar region 18 between edges of horizontally opposing patterned ARC layers 14 is typically from 1 mm to 5 mm, while the width, $w_2$, of an individual finger regions 20 between two vertically opposed patterned ARC layers is typically from 10 microns to 100 microns. In the embodiment illustrated in FIGS. 7A and 7B, the width, $w_3$, of the dummy lines 52B in the busbar region 18 is from 2 microns to 20 microns, while the width, $w_4$, of the real lines 52A in the busbar region 18 is from 1 mm to 5 mm. In the embodiment illustrated in FIG. 7C, the width, $w_5$, of the dummy lines 52B in the finger regions 20 is from 1 microns to 10 microns, while the width, $w_6$, of the real lines 52A in the finger regions 20 is from 10 microns to 100 microns. The distance from the real line 52A to the dummy line 52B is from 2 microns to 20 microns.

Figure 8:
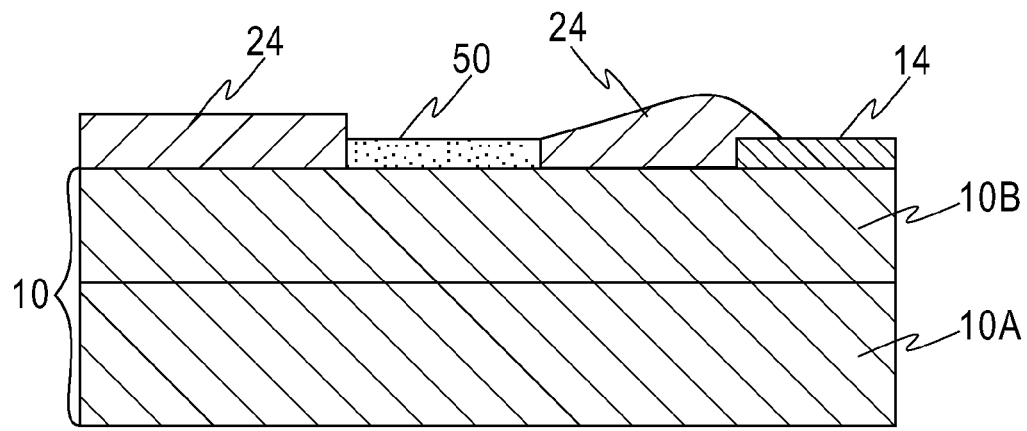
FIG. 8 is a pictorial representation (through a cross sectional view) illustrating the structure of FIGS. 7A-7C after electrodepositing a metal layer on the real line and dummy lines of the structure.

Referring now to FIG. 8, there is illustrated the structure of FIGS. 7A and 7B after electrodeposition of metal layer 24; in this embodiment metal layer 24 represents a first metal layer. The metal layer 24 includes one of the metals mentioned above in the first embodiment, and metal layer 24 can be formed as described above in the first embodiment of the present disclosure.

In this embodiment, the metal layer 24 formed on the real lines 52A has a first thickness, while the metal layer 24 formed on the dummy lines 52B has a second thickness that is greater than that first thickness of the metal layer 24 formed on the real lines 52A. In one embodiment, the first thickness is from 5 nm to 500 nm, while the second thickness is from 50 nm to 5000 nm. In another embodiment, the first thickness is from 20 nm to 100 nm, while the second thickness is from 150 nm to 1000 nm. In another embodiment, the first thickness of the metal layer 24 that is formed on the real line 52A of the busbar region 18 has a thickness variation that is less than 30%, while the thickness variation of the metal layer 24 on the dummy lines 52B of the busbar region 18 is much greater than that on the real line 52A of the busbar region 18.

Figure 9:
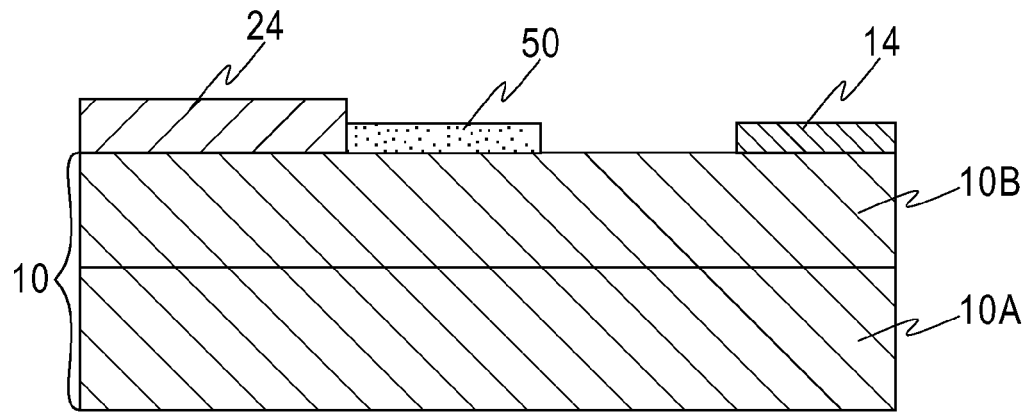
FIG. 9 is a pictorial representation (through a cross sectional view) illustrating the structure of FIG. 8 after removing the metal layer from the dummy lines.

Referring now to FIG. 9, there is illustrated the structure of FIG. 8 after etching the metal layer 24 from atop the dummy lines 52B, while keeping the metal layer 24 on the real lines 52A connected to the electrodeposition apparatus. As such, the metal layer 24 on the real lines 52A is cathodically protected during etching of the metal layer 24 from atop the dummy lines 52B. The etching of the metal layer 24 atop the dummy lines 52B can be achieved utilizing a chemical etchant that selectively removes the non-cathodically protected portion of the metal layer 24 from the structure. In one embodiment, $HNO_3$ can be used to remove the non-cathodically protected portion of the metal layer 24 from atop the dummy lines 52B of the structure. In another embodiment, a mixture of $H_2SO_4$ and citric acid can be used.

Figure 10:
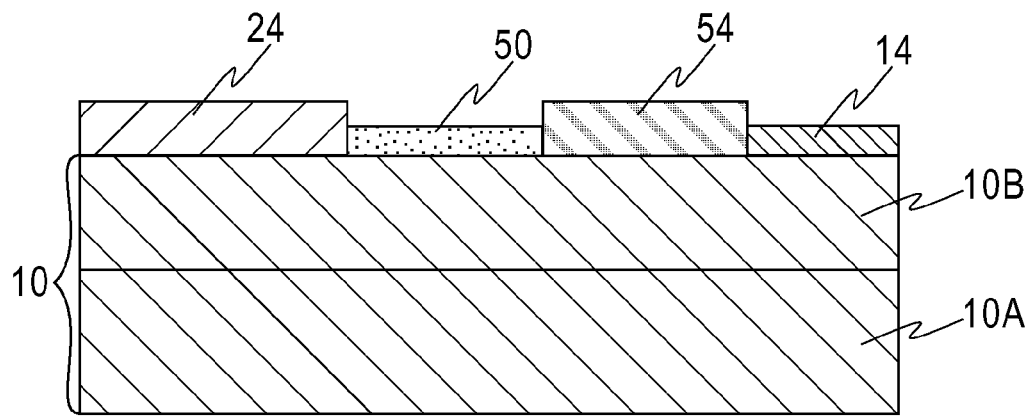
FIG. 10 is a pictorial representation (through a cross sectional view) illustrating the structure of FIG. 9 after electrodepositing a second metal layer on the dummy lines of the structure.

Referring now to FIG. 10, there is illustrated the structure of FIG. 9 after performing a second electrodeposition process in which a second metal layer 54 is formed atop the exposed dummy lines 52B of the structure. The second metal layer 54 that can be formed includes one of the metals or metal alloys mentioned above for use as the metal layer 24. In one embodiment, the second metal layer 54 comprises the same metal or metal alloy as metal layer 24. In another embodiment, the second metal layer 54 comprises a different metal or metal alloy as metal layer 24. The second metal layer 54 is formed utilizing the same electrodeposition technique as used in forming the metal layer 24.

In one embodiment, the second metal layer 54 that is formed on the dummy lines 52B of the structure has a thickness from 5 nm to 500 nm. In another embodiment, the second metal layer 54 that is formed on the dummy lines 52B has a thickness from 20 nm 100 nm. The second metal layer 54 that is formed in this embodiment has a thickness variation of less than 30%.

Figure 11:
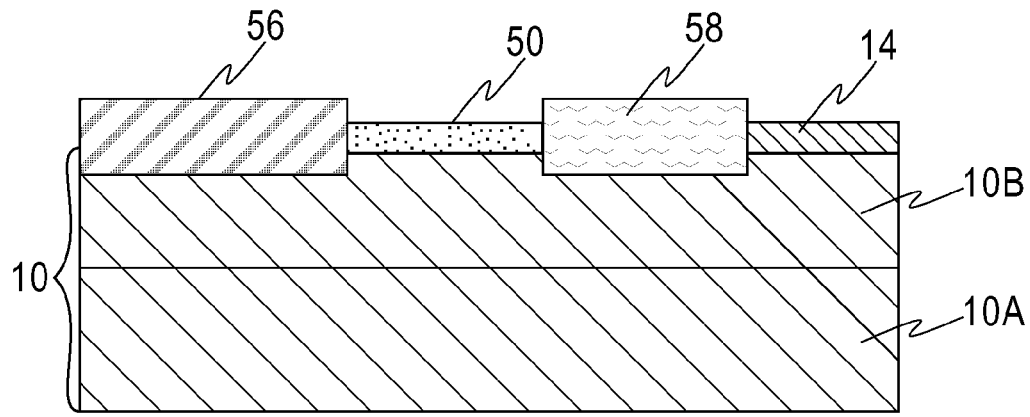
FIG. 11 is a pictorial representation (through a cross sectional view) illustrating the structure of FIG. 10 after annealing the first and second metal layers forming first and second metal semiconductor alloys.

FIG. 11 shows the structure that is formed after annealing the metal layer 24 and the second metal layer 54 forming a structure including a first metal semiconductor alloy layer 56 (which includes the metal or metal alloy of metal layer 24) and a second metal semiconductor alloy layer 58 (which includes the metal or metal alloy of the second metal layer 54). The annealing of the first and second metal layers can be performed as described above in the first embodiment of the present disclosure. In this embodiment, the resultant first and second metal semiconductor alloy layers 56, 58 have a thickness variation of less than 30%. After annealing, any non-reacted first and second metal layers can be removed utilizing a selectivity etching process.

Figure 12:
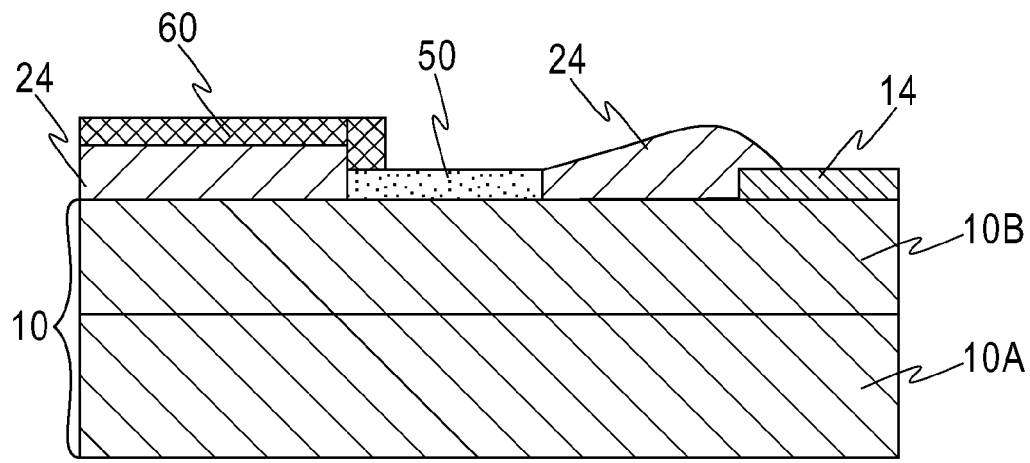
FIG. 12 is a pictorial representation (through a cross sectional view) illustrating the structure of FIG. 8 after forming a protective material atop the first metal layer that is formed on the real line of the structure.

Reference is now made to FIG. 12 which illustrates the structure of FIG. 8 after forming a protective material 60 on the exposed surface of the first metal layer 24 that is formed atop the real lines 52A. The protective material 60 can be formed by electrodeposition of a metal or metal alloy that differs from that of the metal or metal alloy within metal layer 24. Since the metal or metal alloy used as the protective material 60 differs from the metal or metal alloy used in forming metal layer 24, the protective material 60 will not be removed utilizing the same etchant as that used in removing the metal layer 24 from atop each of the dummy lines 52B.

Figure 13:
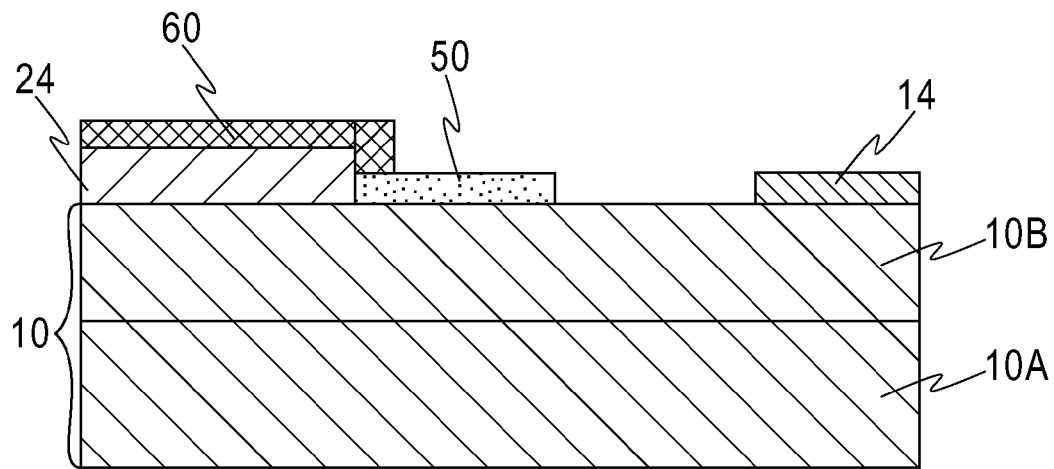
FIG. 13 is a pictorial representation (through a cross sectional view) illustrating the structure of FIG. 12 after removing the metal layer from the dummy lines of the structure.

FIG. 13 illustrates the structure of FIG. 12 after removing the metal layer 24 from atop the dummy lines 52B of the structure. In this embodiment, the etchant employed is highly selective in removing the exposed metal layer 24 from atop the dummy lines 52B of the structure, as compared to the protective material 60. In one embodiment, the metal layer 24 is Ni, the protective material 60 is Ag, and a 7% $HNO_3$ solution can be used to remove the metal layer 24 from atop the dummy lines 52B, while not removing the protective material 60.

Figure 14:
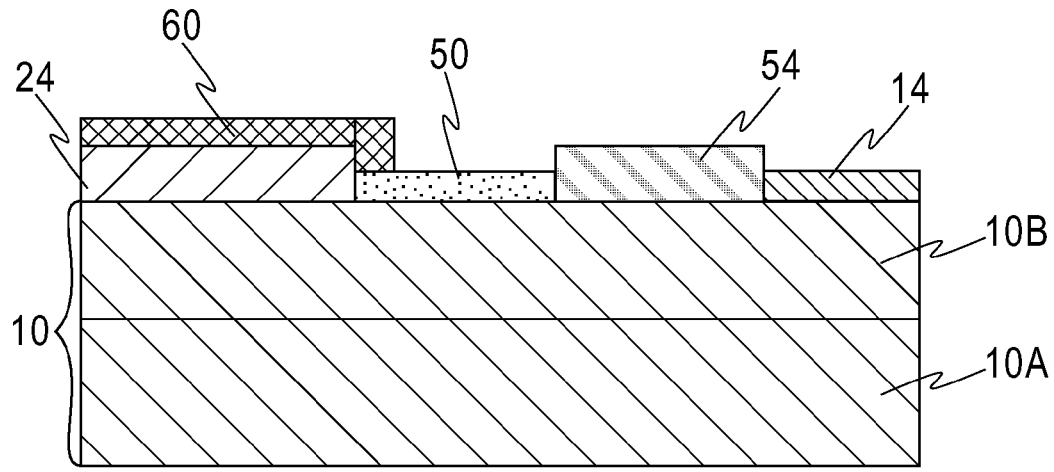
FIG. 14 is a pictorial representation (through a cross sectional view) illustrating the structure of FIG. 13 after electrodepositing a second metal layer on the dummy lines of the structure.

FIG. 14 illustrates the structure of FIG. 13 after forming a second metal layer 54 atop the exposed dummy lines 52B of the structure. The second metal layer 54 is the same as that described above in the previous embodiment of the present disclosure.

Figure 15:
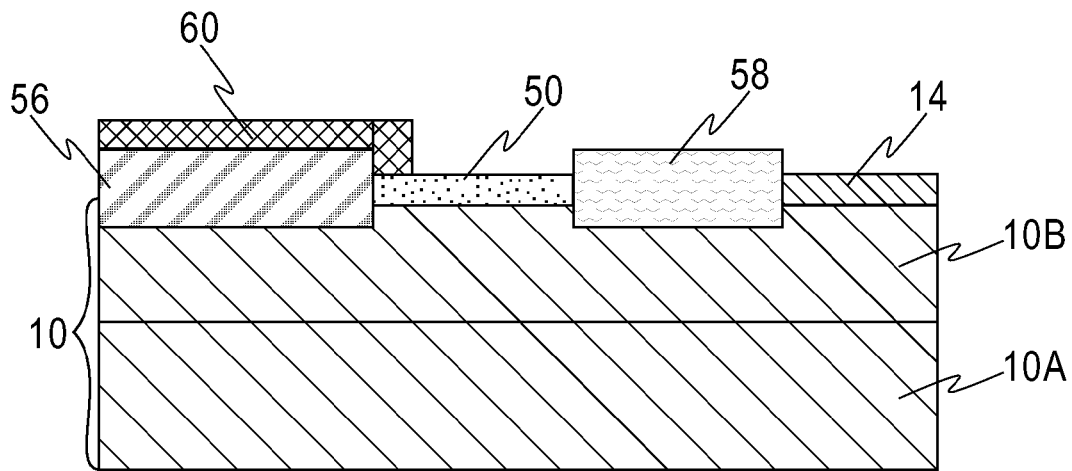
FIG. 15 is a pictorial representation (through a cross sectional view) illustrating the structure of FIG. 14 after annealing to form first and second metal semiconductor alloys, wherein the first metal semiconductor alloy on the real line is capped with the protective material.

FIG. 15 illustrates the structure of FIG. 14 after annealing that forms a first metal semiconductor alloy 56 on the real lines 52A of the structure and a second metal semiconductor alloy 58 on the dummy lines 52B of the structure. The annealing process used in this embodiment is the same as that described in the first embodiment of the present disclosure. During the anneal, the protective material 60 remains atop the real lines 52A of the structure and after annealing the first metal semiconductor alloy 56 is capped with the protective material 60. In some embodiments, the protective material 60 and any unreacted first and second metal layers can be removed from the structure utilizing any etchant (or combination of etchants) that selectively removes the protective material 60 and unreacted portions of metal layer 24 and second metal layer 54 from the structure as compared to the underlying first and second metal semiconductor alloy layers 56, 58. The protective material 60 and the unreacted portions of metal layer 24 can also be removed applying an anodic current.

Figure 16:
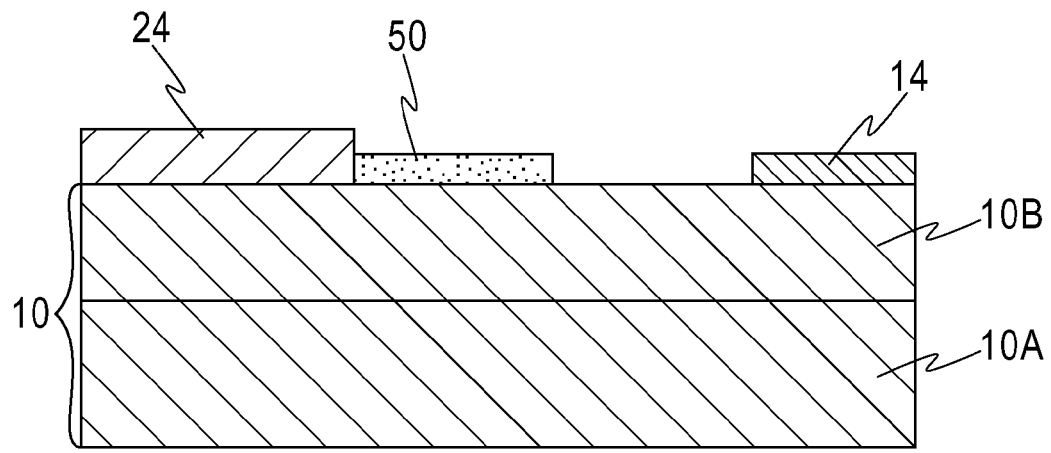
FIG. 16 is a pictorial representation (through a cross sectional view) illustrating the structure of FIG. 13 after removing the protective material from atop the metal layer that is located on the real line.

In some embodiments and as shown in FIG. 16, the protective material 60 can be removed from the structure shown in FIG. 13 prior to forming the second metal layer 54 on the dummy lines 52B of the structure. The protective material 60 can be removed utilizing an etching that is highly selective in removing the protective material 60 as compared to the underlying first metal layer 24 on the real lines 52A of the structure. The process then proceeds as shown in FIGS. 14 and 15 without the presence of the protective material 60.

Figure 17:
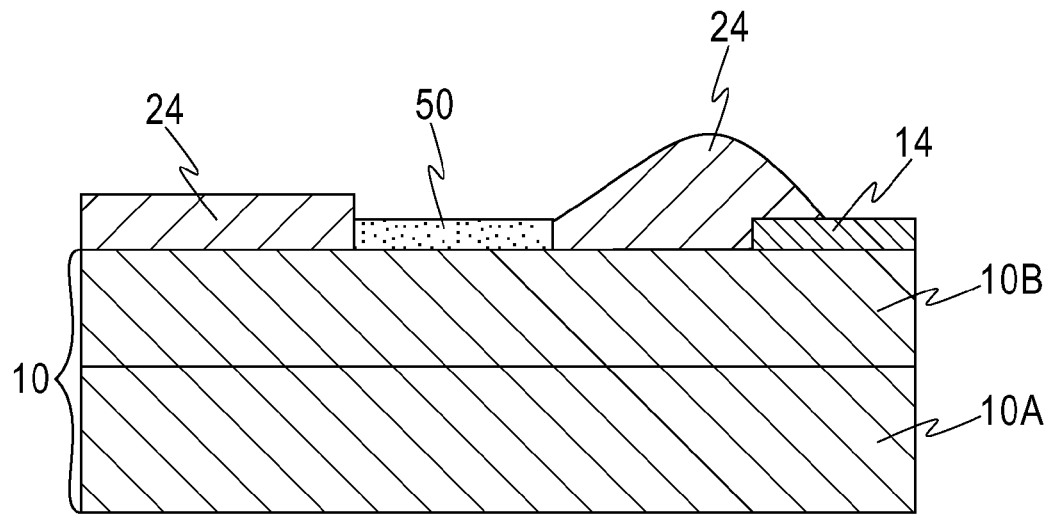
FIG. 17 is a pictorial representation (through a cross sectional view) illustrating a structure similar to the one depicted in FIG. 8 except that the metal layer on the dummy lines has a thickness that induces internal stress to the metal layer.

Reference is now made to FIG. 17 which illustrates a structure similar to the one depicted in FIG. 8 except that the thickness of the metal layer 24 formed on the dummy lines 52B has a thickness which is great enough to induce an internal stress of the metal layer 24 formed on the dummy lines 52B of the structure. The stress in the metal layer 24 on the dummy lines 52B depends on its thickness, chemical composition and additive incorporation. In this embodiment, the metal layer 24 that is formed on the dummy lines 52B has a thickness from 200 nm to 2000 nm. Since an internal stress is imparted to the metal layer 24 on the dummy lines 52B of the structure, the metal layer 24 can self-delaminate from the dummy lines 52B of the structure. In some embodiments, a thermal treatment at a temperature from 100° C. to 250° C. can be used to increase the stress of the metal layer 24 that is formed on the dummy lines 52B of the structure. After delamination of the metal layer 24 from the dummy lines 52B, a second metal layer 54 and annealing can be performed to form a structure such as is shown, for example, in FIG. 11.

Figure 18:
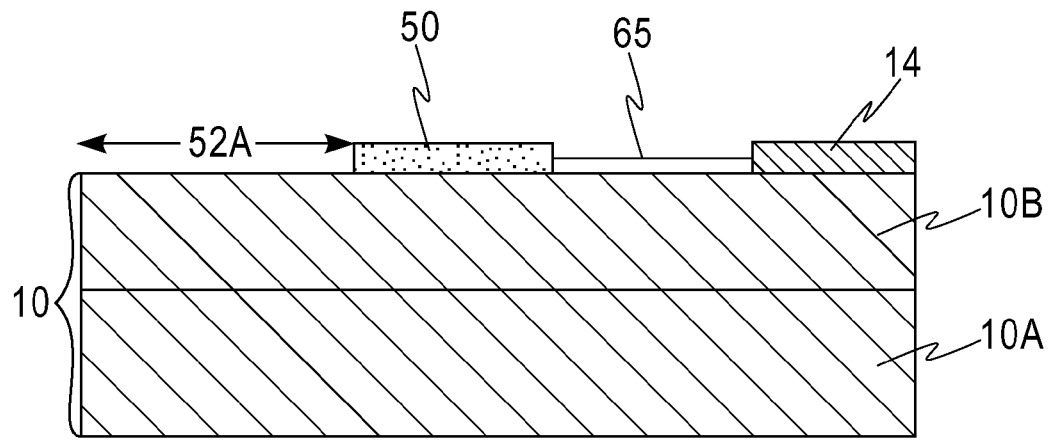
FIG. 18 is a pictorial representation (through a cross sectional view) illustrating the structure of FIGS. 7A-7B after performing a surface treatment step that forms a surface layer on the dummy lines which is resistant to formation of a metal semiconductor alloy.

Reference is now made to FIG. 18 which illustrates the structure of FIGS. 7A-7B after performing a surface treatment that forms a surface layer 65 on the dummy lines 52B which is resistant to formation of a metal semiconductor alloy. In one embodiment, the structure shown in FIGS. 7A-7B is placed in a metal free solution such as a water solution, and a negative bias is applied to the p-type semiconductor portion 10A of the semiconductor substrate 10.

Figure 19:
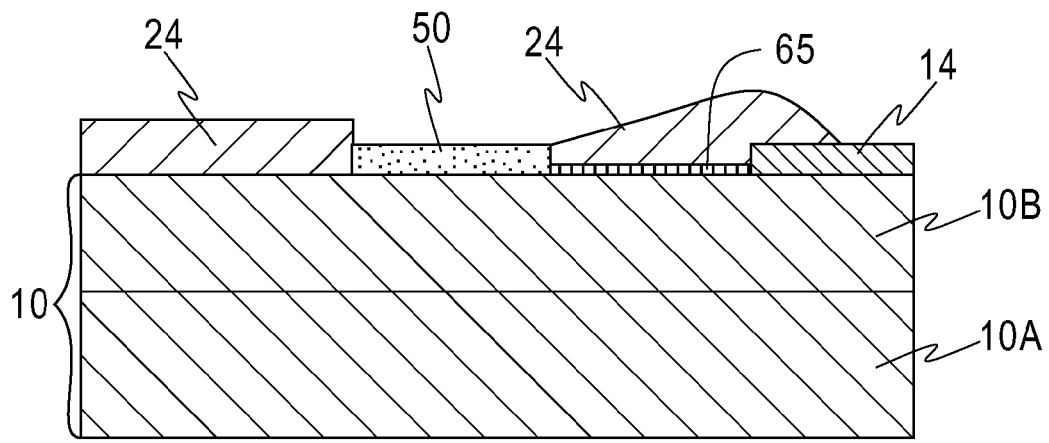
FIG. 19 is a pictorial representation (through a cross sectional view) illustrating the structure of FIG. 18 after electrodepositing a metal layer on the real line and dummy lines of the structure.

Referring now to FIG. 19, there is illustrated the structure of FIG. 18 after forming the metal layer 24 on the real lines and the dummy lines of the structure. The first metal layer 24 is the same as that described above in the first embodiment, and the first metal layer 24 of this embodiment is formed utilizing the same technique mentioned above for forming the metal layer 24 in the first embodiment as well.

Figure 20:
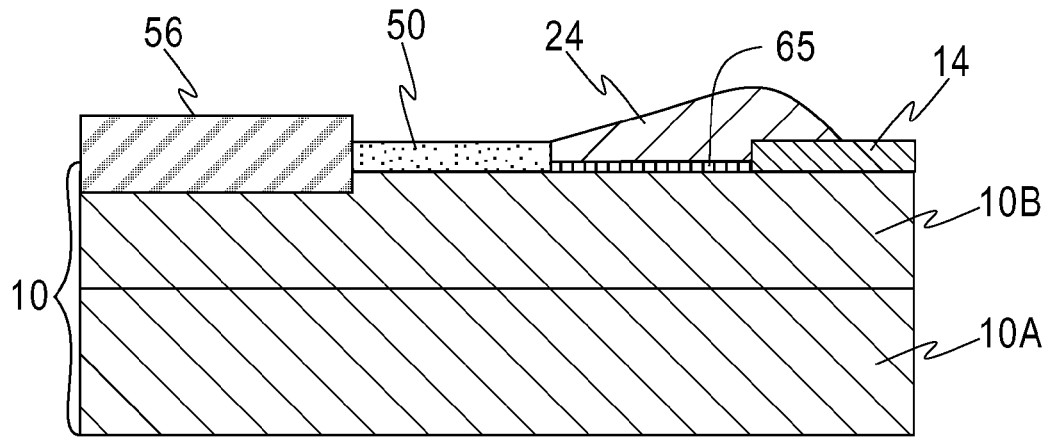
FIG. 20 is a pictorial representation (through a cross sectional view) illustrating the structure of FIG. 19 after annealing to form a first metal semiconductor alloy on the real line.

Next, and as shown in FIG. 20, an anneal (as also described above in the first embodiment) is performed forming a metal semiconductor alloy 56 on the real lines 52A of the structure. No metal semiconductor alloy forms on the dummy lines 52B since the metal layer 24 was formed on surface layer 65 that is resistant to metal semiconductor alloy formation.

Figure 21:
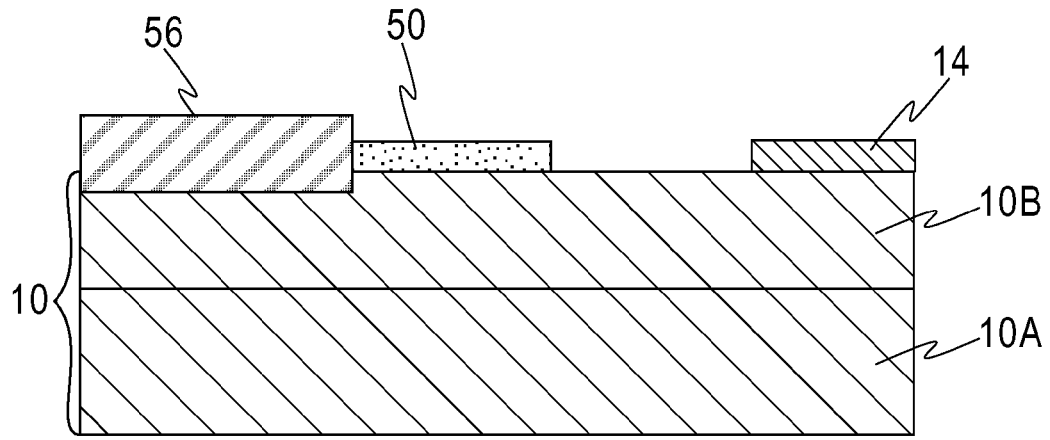
FIG. 21 is a pictorial representation (through a cross sectional view) illustrating the structure of FIG. 20 after removing the first metal layer and the surface layer from atop the dummy lines.
Figure 22:
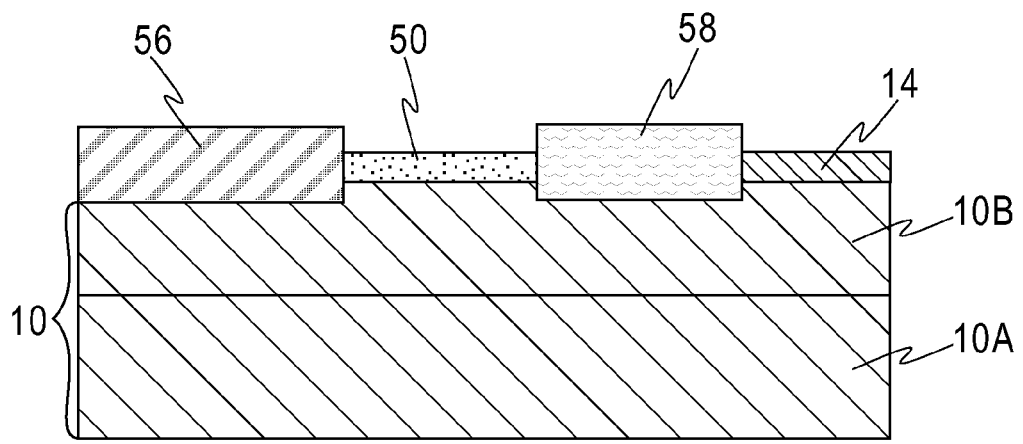
FIG. 22 is a pictorial representation (through a cross sectional view) illustrating the structure of FIG. 21 after electrodepositing a metal layer and forming a second metal semiconductor alloy on the dummy lines.

Next, and as shown in FIG. 21, the metal layer 24 and the surface layer 65 are removed from the dummy lines 52B of the structure utilizing a selective etching solution. This etching solution can be same as the one used in previous embodiment for removing unreacted portion of metal layer 24 atop the real lines 52A. The surface layer 65 can be removed by diluted HF. After removing the metal layer 24 and the surface layer 65 from the dummy lines 52B of the structure, a second metal layer 54 is formed on the dummy lines 52B and then an anneal is performed forming a second metal semiconductor alloy 58 within the dummy lines 52B of the structure. Such as structure, is shown for example, in FIG. 22.

Figure 7C:
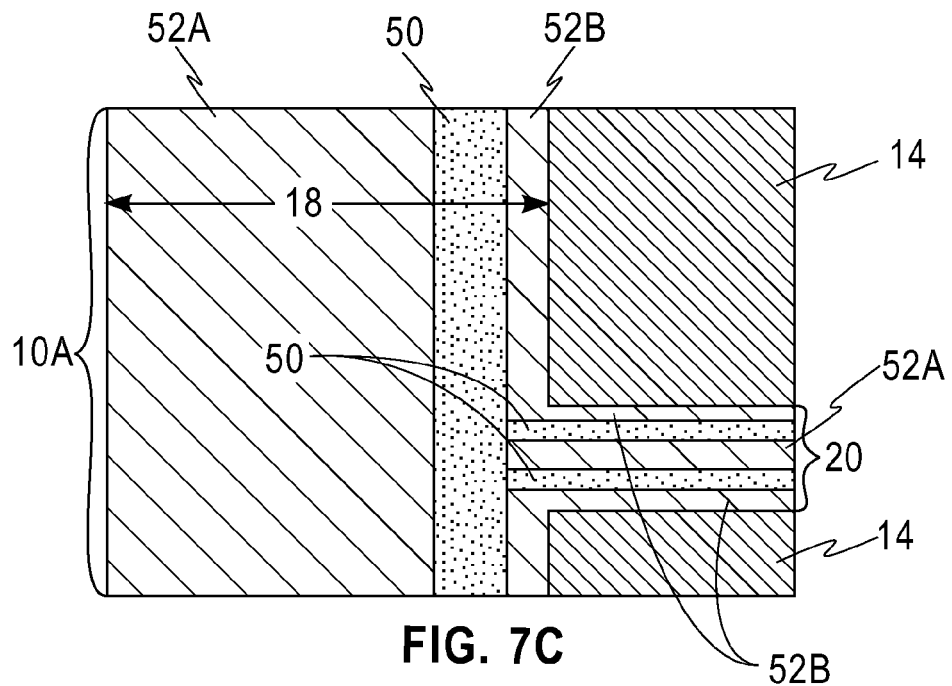
FIG. 7C is a pictorial representation (through a top down view) illustrating the structure of FIG. 6 after breaking up the initial pattern to include a real line and dummy lines in the busbar region and the finger regions of the structure.
Figure 23:
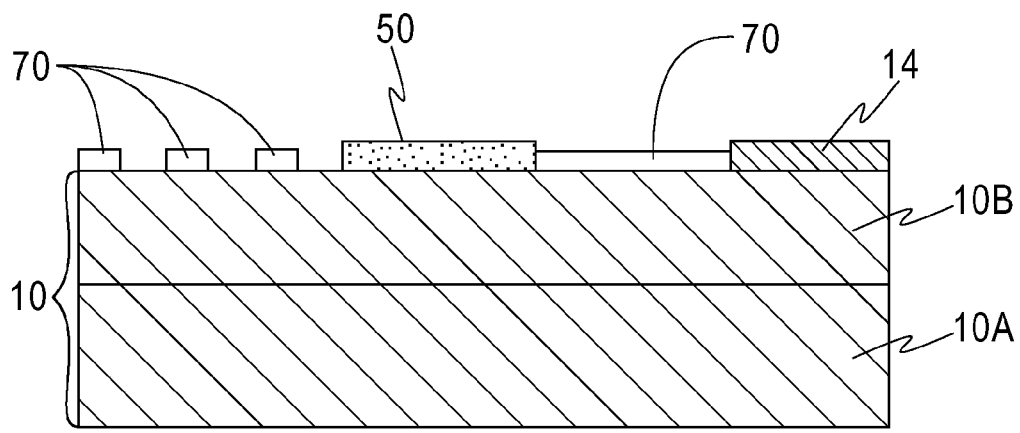
FIG. 23 is a pictorial representation (through a cross sectional view) illustrating the structure of FIGS. 7A-7B after electrodeposition of a sacrificial metal layer on the real line and on the dummy lines, wherein the sacrificial metal layer on the real line is discontinuous and wherein the sacrificial metal layer on the dummy lines is continuous.

Reference is now made to FIG. 23 which illustrates the structure of FIGS. 7A-7C after electrodeposition of a sacrificial metal layer 70 on the real lines 52A and the dummy lines 52B of the structure. In this embodiment, sacrificial metal layer 70 includes one of the metals mentioned above for metal layer 24, but different from the metal layer 24. The electrodeposition process used in forming sacrificial metal layer 70 is the same as mentioned above for forming metal layer 24. The sacrificial metal layer 70 that is formed on the real lines 52A is discontinuous, while the sacrificial metal layer 70 formed on the dummy lines 52B is continuous. In an embodiment of the disclosure, a first layer of metal layer is formed in the real lines 52A, while a second metal layer is formed in the dummy lines 52B. The thickness of the second metal layer in the dummy lines is from 10 nm to 100 nm. The thickness of the first metal layer in the real line is always smaller than in the dummy line because of the reason stated in the first embodiment in the present disclosure. The average thickness of the first metal layer is from 1 nm to 20 nm, and a discontinuous film can be achieved when the plating current density is from 1 mA/cm$^2$ to 20 mA/cm$^2$.

Figure 24:
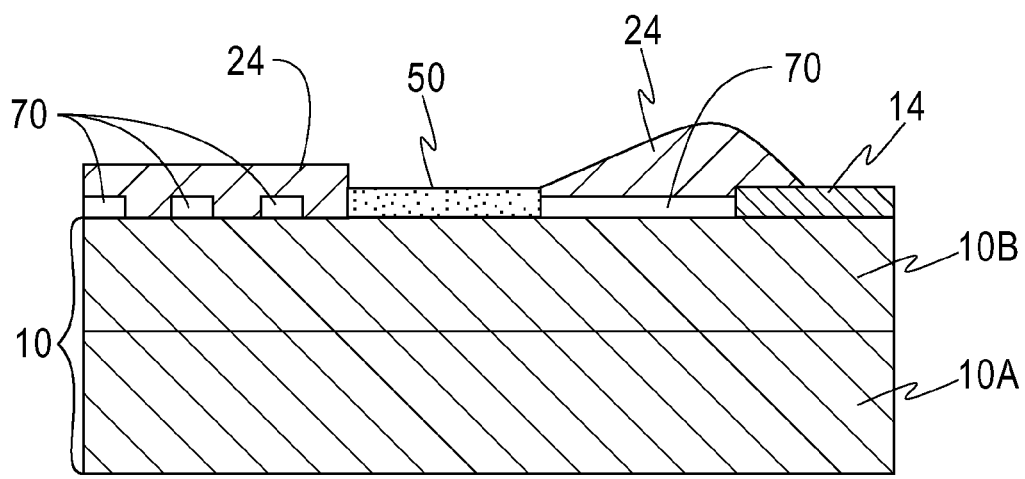
FIG. 24 is a pictorial representation (through a cross sectional view) illustrating the structure of FIG. 23 after electrodeposition of a metal layer atop the real line and dummy lines of the structure.

Referring now to FIG. 24, there is illustrated the structure of FIG. 23 after forming metal layer 24 on both the real lines 52A and the dummy lines 52B of the structure. In this embodiment, metal layer 24 is a metal that forms a metal semiconductor alloy with the underlying portion of semiconductor substrate at a lower annealing temperature than that of sacrificial metal layer 70. In one embodiment, metal layer 24 is comprised of Ni, while sacrificial metal layer 70 is comprised of Co. In the embodiment illustrated, the metal layer 24 that is formed atop the real lines 52A of the structure forms atop and between the discontinuous sacrificial metal layer 70, while the metal layer 24 that is formed atop the dummy lines 52B forms on sacrificial metal layer 70.

Figure 25:
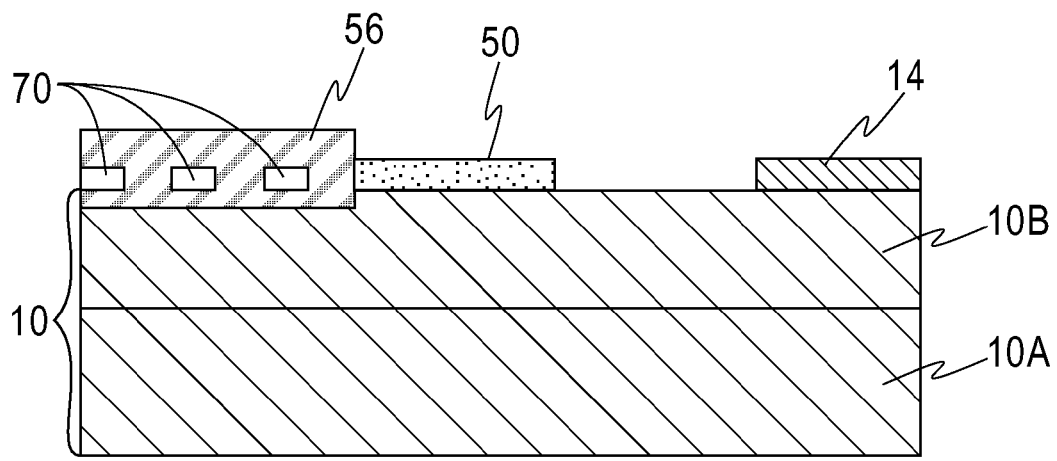
FIG. 25 is a pictorial representation (through a cross sectional view) illustrating the structure of FIG. 24 after performing an anneal that forms a first metal semiconductor alloy on the real line of the structure and removing the sacrificial metal layer and the first metal layer from atop the dummy lines.

Referring now to FIG. 25, there is illustrated the structure of FIG. 24 after performing an anneal at a temperature that forms a metal semiconductor alloy layer 56 on the real lines 52A of the structure, but not on the dummy lines 52B of the structure. After forming metal semiconductor alloy layer 56, the metal layer 24 and the sacrificial metal layer 70 are removed from the dummy lines 52B utilizing an etch that selectively removes metal layers 24 and 70 selective to metal semiconductor alloy layer 56.

Figure 26:
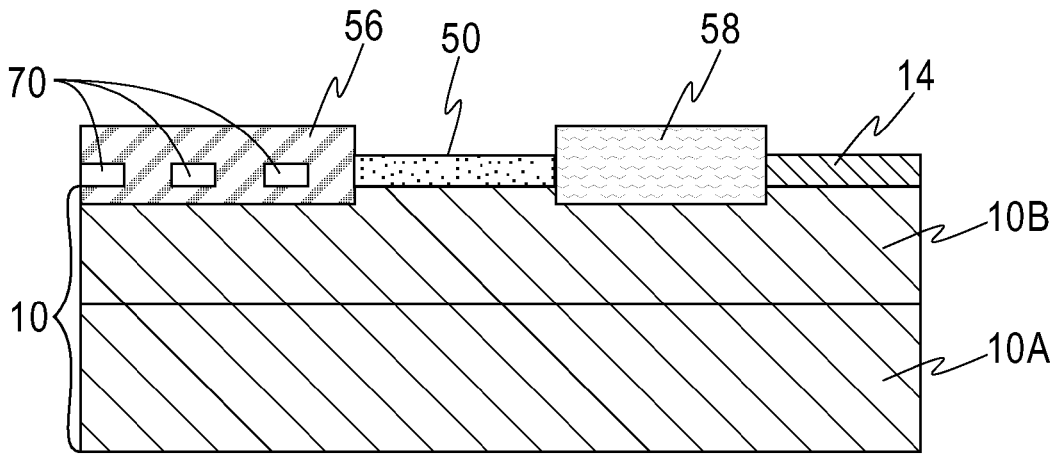
FIG. 26 is a pictorial representation (through a cross sectional view) illustrating the structure of FIG. 25 after electrodepositing a metal layer and forming a second metal semiconductor alloy on the dummy lines of the structure.

Referring now to FIG. 26, there is illustrated the structure of FIG. 25 after forming a second metal layer and annealing to form a second metal semiconductor alloy 58 on the dummy lines 52B of the structure. The second metal layer is the same as that described above, and the anneal is the same as mentioned above as well.

Figure 27:
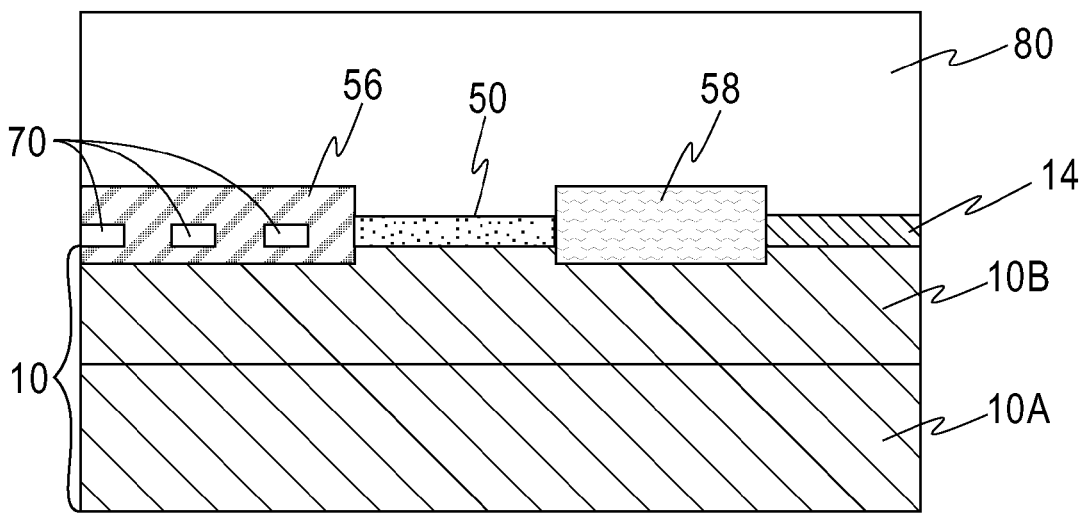
FIG. 27 is a pictorial representation (through a cross sectional view) illustrating the structure of FIG. 26 after forming a conductive material atop the first and second metal semiconductor alloys.

In any of the embodiments described herein, conductive materials such as Cu, Ni, Co, Ag, and Sn, can be plated atop the first and second metal semiconductor alloy layers utilizing a conventional electrodeposition process to complete provide the metallization of the front side patterns. One such structure is shown, for example, in FIG. 27 in which element 80 is the conductive material. In one embodiment of the present disclosure, a first layer of Ni is formed atop the metal semiconductor alloy, and a second layer of Cu is formed atop the Ni layer. In another embodiment of the present disclosure, a third layer of Sn is formed atop Cu layer. The conductive materials on the first metal semiconductor alloy 56 and on the second metal semiconductor alloy 58 may or may not be coalescent, i.e., fused together. In the embodiment shown in FIG. 27 the conductive materials are coalescent.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of fabricating a photovoltaic device comprising:

providing a semiconductor substrate including a p-n junction with a p-type semiconductor portion and a n-type semiconductor portion one lying on top of the other, wherein an upper exposed surface of the semiconductor substrate represents a front side surface of the semiconductor substrate;

forming a plurality of patterned antireflective coatings on the front side surface of the semiconductor surface to provide a grid pattern including a busbar region and finger regions, said busbar region and the finger regions are comprised of exposed portions of the front side surface of the semiconductor substrate;

forming a patterned mask within at least the busbar region to break the busbar region into a real line interposed between two dummy lines;

electrodepositing a first metal layer on the real line and dummy lines;

removing the first metal layer from atop the dummy lines;

electrodepositing a second metal layer atop the exposed dummy lines; and performing an anneal, wherein during the anneal metal atoms from the first metal layer react with semiconductor atoms from the real line forming a first metal semiconductor alloy and wherein metal atoms from the second metal layer react with semiconductor atoms from the dummy lines forming a second metal semiconductor alloy on the dummy lines.

2. The method of claim 1, wherein during said removing of the first metal layer from said dummy lines, said real line is cathodically protected.

3. The method of claim 1, wherein said electrodepositing of said first metal layer and said second metal layer includes light illumination having an intensity of greater than 50 W/m$^2$.

4. The method of claim 1, wherein the first metal layer and the second metal layer are comprised of the same metal or metal alloy.

5. The method of claim 1, further comprising forming a conductive material atop the first and second metal semiconductor alloys.

6. The method of claim 1, further comprising forming a protective material atop the first metal layer that is formed on the real line prior to said removing the first metal layer from the dummy lines, and wherein said protective material remains atop the first metal layer during said annealing.

7. The method of claim 1, further comprising forming a protective material atop the first metal layer that is formed on the real line prior to said removing the first metal layer from the dummy lines, and removing the protective material after said removing the first metal layer from said dummy lines.

8. The method of claim 1, further comprising treating a surface of the dummy lines prior to forming the first metal layer, wherein said treating forms a surface layer atop the dummy lines that is resistant to forming a metal semiconductor alloy, and wherein said surface layer is removed prior to said electrodepositing of said second metal layer.

9. The method of claim 1, wherein said first and second metal layers both comprise Ni.

10. The method of claim 1, further comprising forming a patterned mask in the finger regions to provide a real line and dummy lines in said finger regions.

11. The method of claim 1, wherein said p-type semiconductor portion is located beneath the n-type semiconductor portion.

* * * * *